US012696746B2

(12) United States Patent
Chu et al.

(10) Patent No.: US 12,696,746 B2
(45) Date of Patent: Jul. 28, 2026

(54) BACKSIDE BPR/BSPDN INTEGRATION WITH BACKSIDE LOCAL INTERCONNECT

(71) Applicant: International Business Machines Corporation, Armonk, NY (US)

(72) Inventors: Albert M. Chu, Nashua, NH (US); Lawrence A. Clevenger, Saratoga Springs, NY (US); Nicholas Anthony Lanzillo, Wynantskill, NY (US); Huai Huang, Clifton Park, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 681 days.

(21) Appl. No.: 17/961,281

(22) Filed: Oct. 6, 2022

(65) Prior Publication Data

US 2024/0120256 A1 Apr. 11, 2024

(51) Int. Cl.
| | |
|---|---|
| *H01L 23/48* | (2006.01) |
| *H01L 21/8234* | (2006.01) |

(Continued)

(52) U.S. Cl.
CPC .......... *H10W 20/20* (2026.01); *H10D 30/014* (2025.01); *H10D 30/43* (2025.01);
(Continued)

(58) Field of Classification Search
CPC .... H10D 30/014; H10D 30/024; H10D 30/43; H10D 30/62; H10D 30/6211; H10D 30/6212; H10D 30/6213; H10D 30/6735; H10D 62/118; H10D 62/119; H10D 62/121; H10D 84/0158; H10D 84/0193; H10D 84/834; H10D 84/853; H01L 21/30625; H01L 21/76224; H01L 21/76816; H01L 23/481; H01L 23/5226; H01L 23/528; H01L 23/5286
See application file for complete search history.

(56) References Cited

U.S. PATENT DOCUMENTS

| | | |
|---|---|---|
| 3,962,052 A | 6/1976 | Abbas et al. |
| 5,811,868 A | 9/1998 | Bertin et al. |

(Continued)

FOREIGN PATENT DOCUMENTS

| | | |
|---|---|---|
| CN | 113299628 A | 8/2021 |
| CN | 113363258 A | 9/2021 |

(Continued)

OTHER PUBLICATIONS

Chen et al., "Design and Optimization of SRAM Macro and Logic Using Backside Interconnects at 2nm node," International Electron Devices Meeting (IEDM), 2021, 22.4, 4 pp.

(Continued)

*Primary Examiner* — David C Spalla
(74) *Attorney, Agent, or Firm* — Seed Intellectual Property Law Group LLP

(57) ABSTRACT

A semiconductor device includes backside power rails located between N channel field effect transistor to N channel field effect transistor spaces, and between at least one P channel field effect transistor to P channel field effect transistor space; and backside local signal lines located between the backside power rails.

13 Claims, 33 Drawing Sheets

(51) Int. Cl.

| | |
|---|---|
| *H01L 27/088* | (2006.01) |
| *H01L 29/06* | (2006.01) |
| *H01L 29/08* | (2006.01) |
| *H01L 29/66* | (2006.01) |
| *H01L 29/775* | (2006.01) |
| *H01L 29/786* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 62/13* | (2025.01) |
| *H10D 84/01* | (2025.01) |
| *H10D 84/03* | (2025.01) |
| *H10D 84/83* | (2025.01) |
| *H10W 20/20* | (2026.01) |

(52) U.S. Cl.
CPC ....... *H10D 30/6757* (2025.01); *H10D 62/121* (2025.01); *H10D 62/151* (2025.01); *H10D 84/0128* (2025.01); *H10D 84/013* (2025.01); *H10D 84/0149* (2025.01); *H10D 84/038* (2025.01); *H10D 84/834* (2025.01)

(56) References Cited

U.S. PATENT DOCUMENTS

| | | | |
|---|---|---|---|
| 5,814,889 A | 9/1998 | Gaul | |
| 6,198,168 B1 | 3/2001 | Geusic et al. | |
| 7,935,571 B2 * | 5/2011 | Ramiah ................. | H01L 23/522 |
| | | | 438/692 |
| 10,586,765 B2 * | 3/2020 | Smith ............... | H01L 21/76895 |
| 10,636,739 B2 | 4/2020 | Beyne et al. | |
| 10,797,139 B2 | 10/2020 | Morrow et al. | |
| 10,833,089 B2 | 11/2020 | Pille et al. | |
| 10,950,546 B1 | 3/2021 | Doornbos | |
| 10,985,064 B2 | 4/2021 | Zhang et al. | |
| 11,004,789 B2 | 5/2021 | Doornbos | |
| 11,270,991 B1 | 3/2022 | Chava et al. | |
| 11,658,172 B2 * | 5/2023 | Lin ................... | H01L 21/76898 |
| | | | 257/774 |
| 11,817,394 B2 | 11/2023 | Farooq et al. | |
| 12,046,643 B2 | 7/2024 | Frougier et al. | |

| | | | |
|---|---|---|---|
| 12,106,969 B2 | 10/2024 | Xie et al. | |
| 12,136,655 B2 | 11/2024 | Xie et al. | |
| 2018/0218973 A1 | 8/2018 | Nelson et al. | |
| 2019/0164882 A1 | 5/2019 | Chen et al. | |
| 2020/0105671 A1 | 4/2020 | Lai et al. | |
| 2020/0266169 A1 | 8/2020 | Kang et al. | |
| 2020/0373242 A1 | 11/2020 | Hiblot et al. | |
| 2021/0104435 A1 | 4/2021 | Son et al. | |
| 2021/0111115 A1 | 4/2021 | Morrow et al. | |
| 2021/0118798 A1 | 4/2021 | Liebmann et al. | |
| 2021/0134721 A1 | 5/2021 | Chiang et al. | |
| 2021/0202385 A1 | 7/2021 | Huang et al. | |
| 2021/0202472 A1 | 7/2021 | Thomson et al. | |
| 2021/0296234 A1 | 9/2021 | Dechene et al. | |
| 2021/0391421 A1 | 12/2021 | Chu et al. | |
| 2022/0020665 A1 * | 1/2022 | Li ....................... H01L 23/5226 | |
| 2022/0301878 A1 | 9/2022 | Xie et al. | |
| 2023/0128985 A1 | 4/2023 | Anderson et al. | |

FOREIGN PATENT DOCUMENTS

| | | |
|---|---|---|
| CN | 114944377 A | 8/2022 |
| CN | 120092502 A | 6/2025 |
| DE | 112023004194 T5 | 8/2025 |
| EP | 4548386 A1 | 5/2025 |
| GB | 2637662 A | 7/2025 |
| WO | 2024/074061 A1 | 4/2024 |

OTHER PUBLICATIONS

Intellectual Property Office, Patents Act 1977: Examination Report under Section 18(3), Jun. 16, 2025, 07 Pages, GB Application No. 2506036.9.

Intellectual Property Office, Patents Act 1977: Search Report under Section 17(5), Oct. 1, 2025, 4 Pages, GB Application No. 2506036.9.

Intellectual Property Office, Patents Act 1977: Examination Report under Section 18(3), Mar. 5, 2026, 4 Pages, GB Application No. 2506036.9.

Intellectual Property Office, "Patents Act 1977: Report of telephone conversation between Joanna Waldie and J.D. Williams of IBM UK Ltd held May 18, 2026", May 18, 2026, 1 Pages, GB Application No. 2506036.9.

* cited by examiner

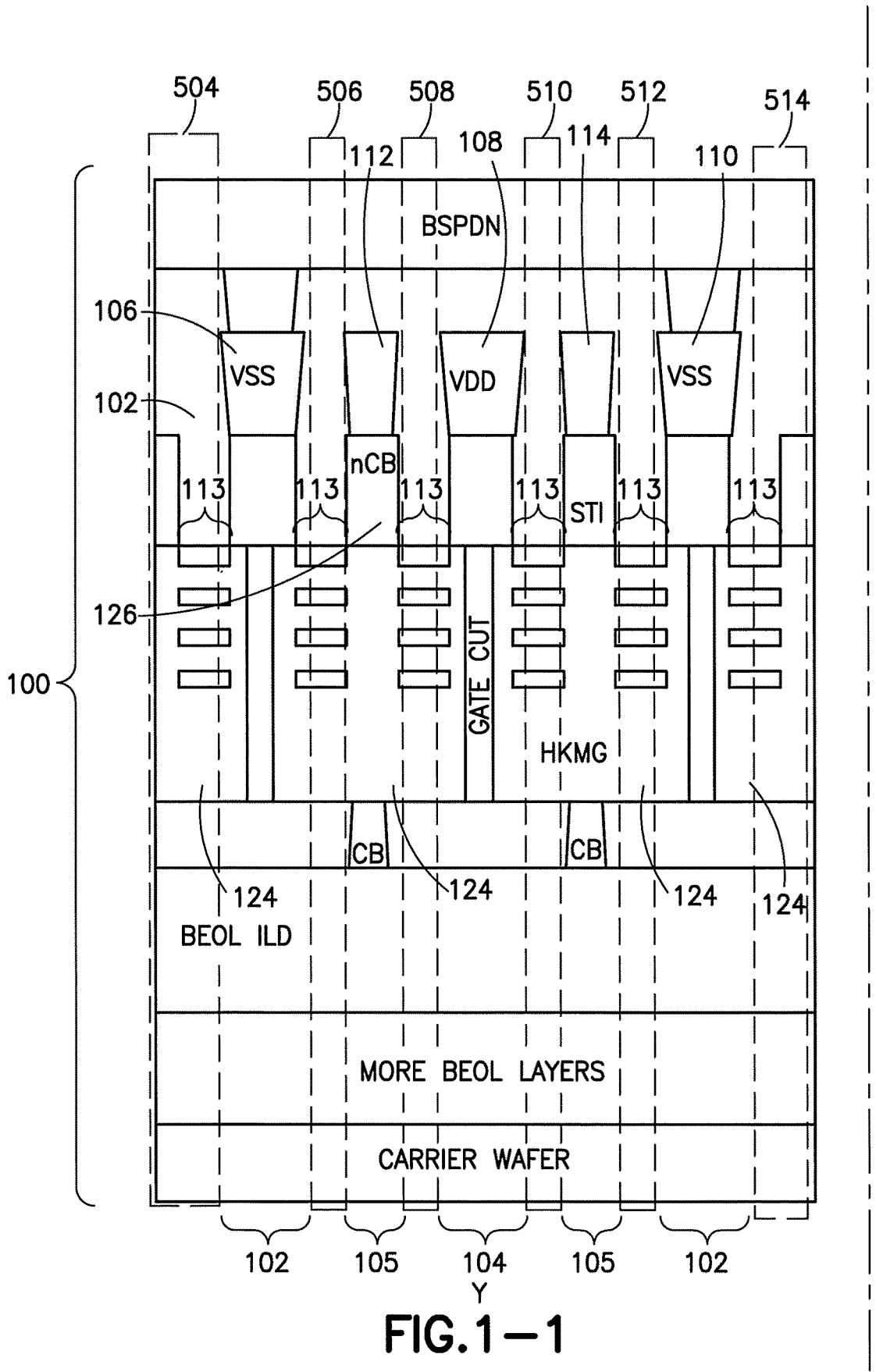
FIG.1—1

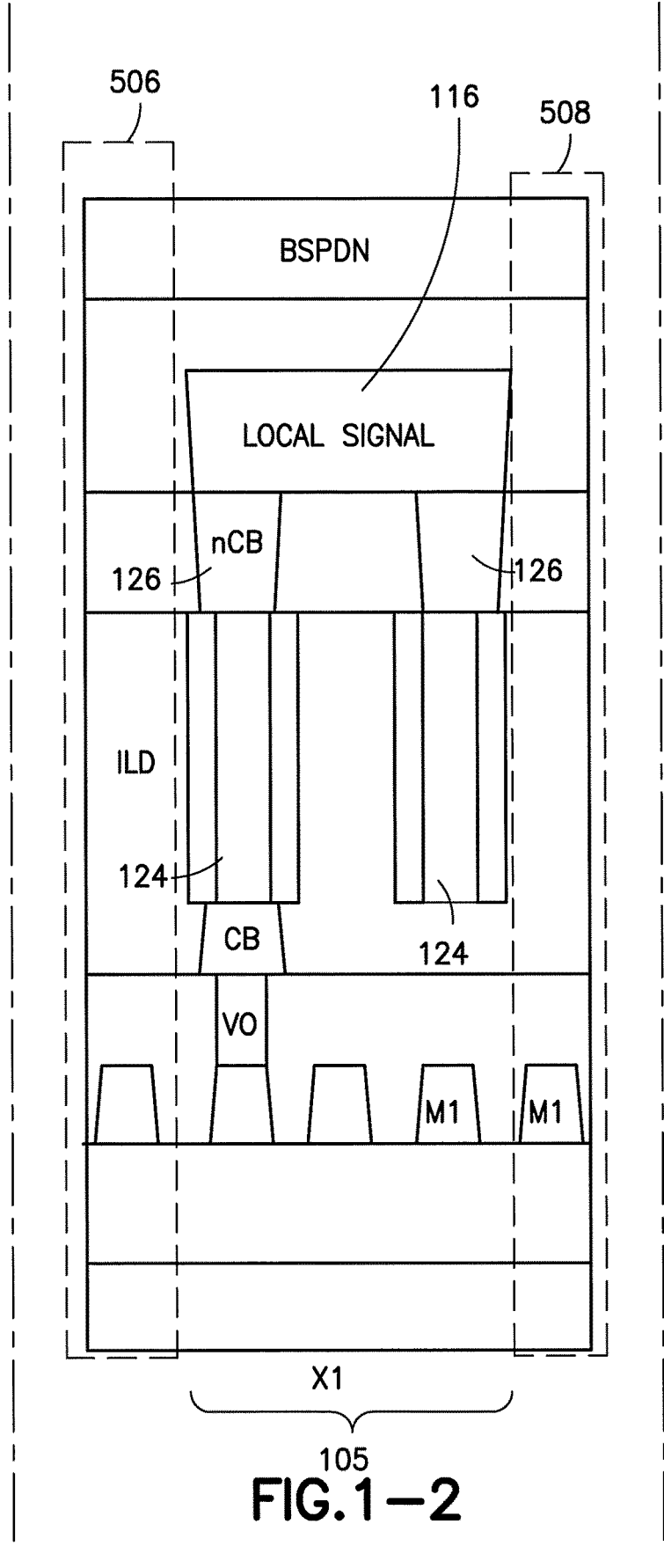
FIG.1−2

| FIG.1−1 | FIG.1−2 | FIG.1−3 |
|---|---|---|

FIG.1−3

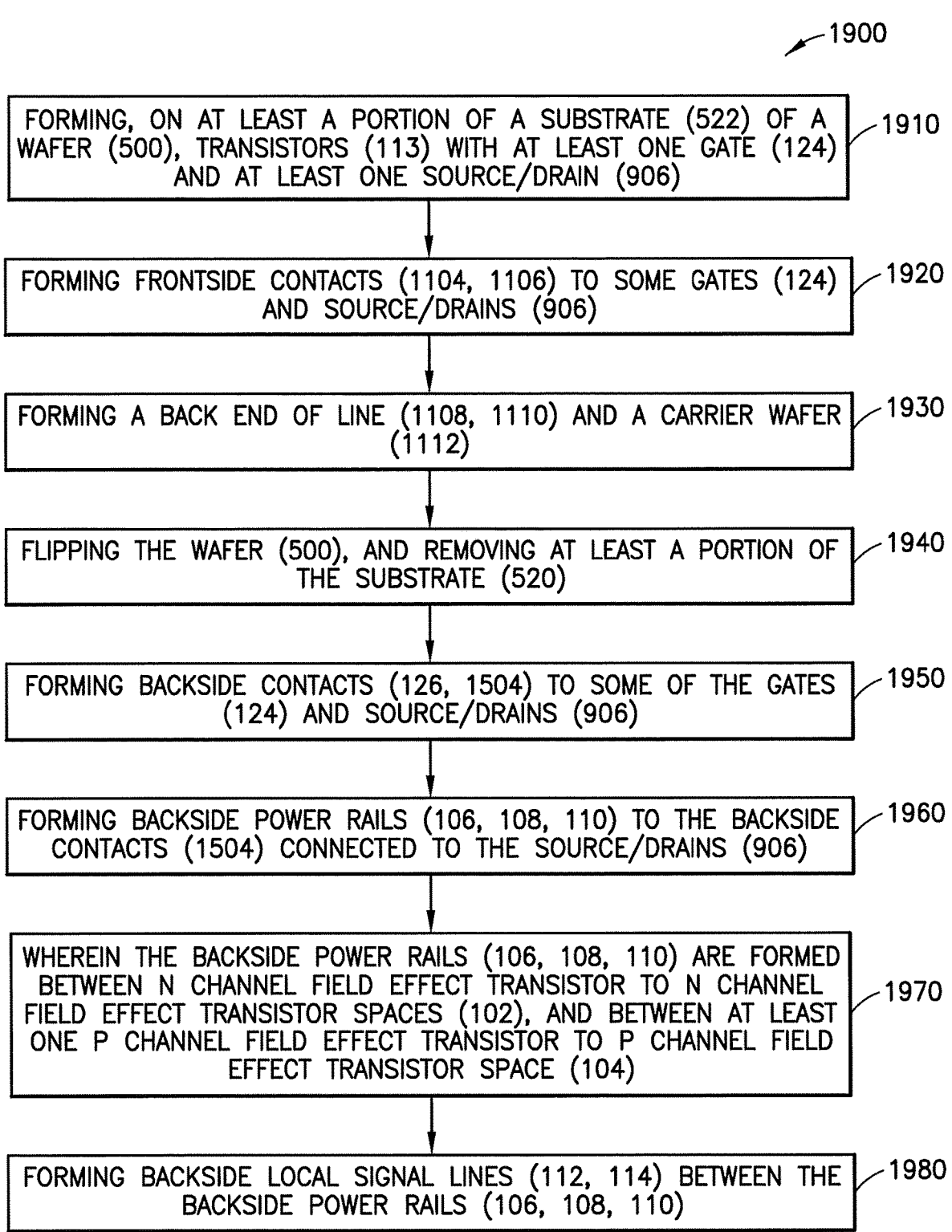

FORMING, ON AT LEAST A PORTION OF A SUBSTRATE (522) OF A WAFER (500), TRANSISTORS (113) WITH AT LEAST ONE GATE (124) AND AT LEAST ONE SOURCE/DRAIN (906) ⟶1910

FORMING FRONTSIDE CONTACTS (1104, 1106) TO SOME GATES (124) AND SOURCE/DRAINS (906) ⟶1920

FORMING A BACK END OF LINE (1108, 1110) AND A CARRIER WAFER (1112) ⟶1930

FLIPPING THE WAFER (500), AND REMOVING AT LEAST A PORTION OF THE SUBSTRATE (520) ⟶1940

FORMING BACKSIDE CONTACTS (126, 1504) TO SOME OF THE GATES (124) AND SOURCE/DRAINS (906) ⟶1950

FORMING BACKSIDE POWER RAILS (106, 108, 110) TO THE BACKSIDE CONTACTS (1504) CONNECTED TO THE SOURCE/DRAINS (906) ⟶1960

WHEREIN THE BACKSIDE POWER RAILS (106, 108, 110) ARE FORMED BETWEEN N CHANNEL FIELD EFFECT TRANSISTOR TO N CHANNEL FIELD EFFECT TRANSISTOR SPACES (102), AND BETWEEN AT LEAST ONE P CHANNEL FIELD EFFECT TRANSISTOR TO P CHANNEL FIELD EFFECT TRANSISTOR SPACE (104) ⟶1970

FORMING BACKSIDE LOCAL SIGNAL LINES (112, 114) BETWEEN THE BACKSIDE POWER RAILS (106, 108, 110) ⟶1980

BACKSIDE BPR/BSPDN INTEGRATION WITH BACKSIDE LOCAL INTERCONNECT

BACKGROUND

The exemplary embodiments described herein relate generally to semiconductor device design and integrated circuit design, and more specifically, to backside power rail (BPR) and backside power distribution network (BSPDN) integration with a backside local interconnect.

The examples described herein provide not only a backside source/drain supply voltage (VDD) and source/drain supply voltage (VSS), but also local signal lines for both gate connection and source/drain (S/D) connection.

SUMMARY

In an aspect, a semiconductor device includes backside power rails located between N channel field effect transistor to N channel field effect transistor spaces, and between at least one P channel field effect transistor to P channel field effect transistor space; and backside local signal lines located between the backside power rails.

In another aspect, a method of forming a semiconductor device includes forming, on at least a portion of a substrate of a wafer, transistors with at least one gate and at least one source/drain; forming frontside contacts to some gates and source/drains; forming a back end of line and a carrier wafer; flipping the wafer, and removing at least a portion of the substrate; forming backside contacts to some of the gates and source/drains; forming backside power rails to the backside contacts connected to the source/drains; wherein the backside power rails are formed between N channel field effect transistor to N channel field effect transistor spaces, and between at least one P channel field effect transistor to P channel field effect transistor space; and forming backside local signal lines between the backside power rails.

In another aspect, a semiconductor device includes two adjacent N channel transistors; two adjacent P channel transistors, wherein a N channel transistor of the two adjacent N channel transistors is adjacent to a P channel transistor of the two adjacent P channel transistors; and wherein backside N channel power rails for the two adjacent N channel transistors are located between the two adjacent N channel transistors and wherein backside P channel power rails for the two adjacent P channel transistors are located between the two adjacent P channel transistors and wherein backside local signal lines for the N channel transistors and P channel transistors are located between the adjacent N channel transistor and P channel transistor.

BRIEF DESCRIPTION OF THE DRAWINGS

The foregoing and other aspects of exemplary embodiments are made more evident in the following Detailed Description, when read in conjunction with the attached Drawing Figures, wherein:

FIG. 18C depicts the cross-section X3, FIG. 19 is a logic flow diagram to fabricate a device, based on the examples described herein.

DETAILED DESCRIPTION

The term "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

Described herein is backside power rail (BPR) and backside power distribution network (BSPDN) integration with a backside local interconnect. The herein described structure not only has a backside source/drain supply voltage (VDD) and source/drain supply voltage (VSS), but also local signal lines for both gate connection and source/drain (S/D) connection. With current structures, there is no co-existence of a backside power rail (BPR) and backside power distribution network (BSPDN) with a local interconnect.

Based on the examples described herein, a method of forming a semiconductor device includes forming transistors with a gate and a source drain (S/D), forming frontside contacts to some gates and S/Ds (source/drains), forming a back end of line and carrier wafer, flipping the wafer, and removing the substrate, forming backside contacts to some gates and S/Ds, forming backside power rails to those backside contacts connected to S/Ds at N2N or P2P spaces, and forming backside local signal lines to backside contacts between the backside power rails, or at N2P spaces.

Based on the examples described herein, a semiconductor device includes two adjacent N channel transistors; two adjacent P channel transistors, wherein a N channel transistor of the two adjacent N channel transistors is adjacent to a P channel transistor of the two adjacent P channel transistors; and wherein backside N channel power rails for the two adjacent N channel transistors are located between the two adjacent N channel transistors and wherein backside P channel power rails for the two adjacent P channel transistors are located between the two adjacent P channel transistors and wherein backside local signal lines for the N channel transistors and P channel transistors are located between the adjacent N channel transistor and P channel transistor.

Figure 1:
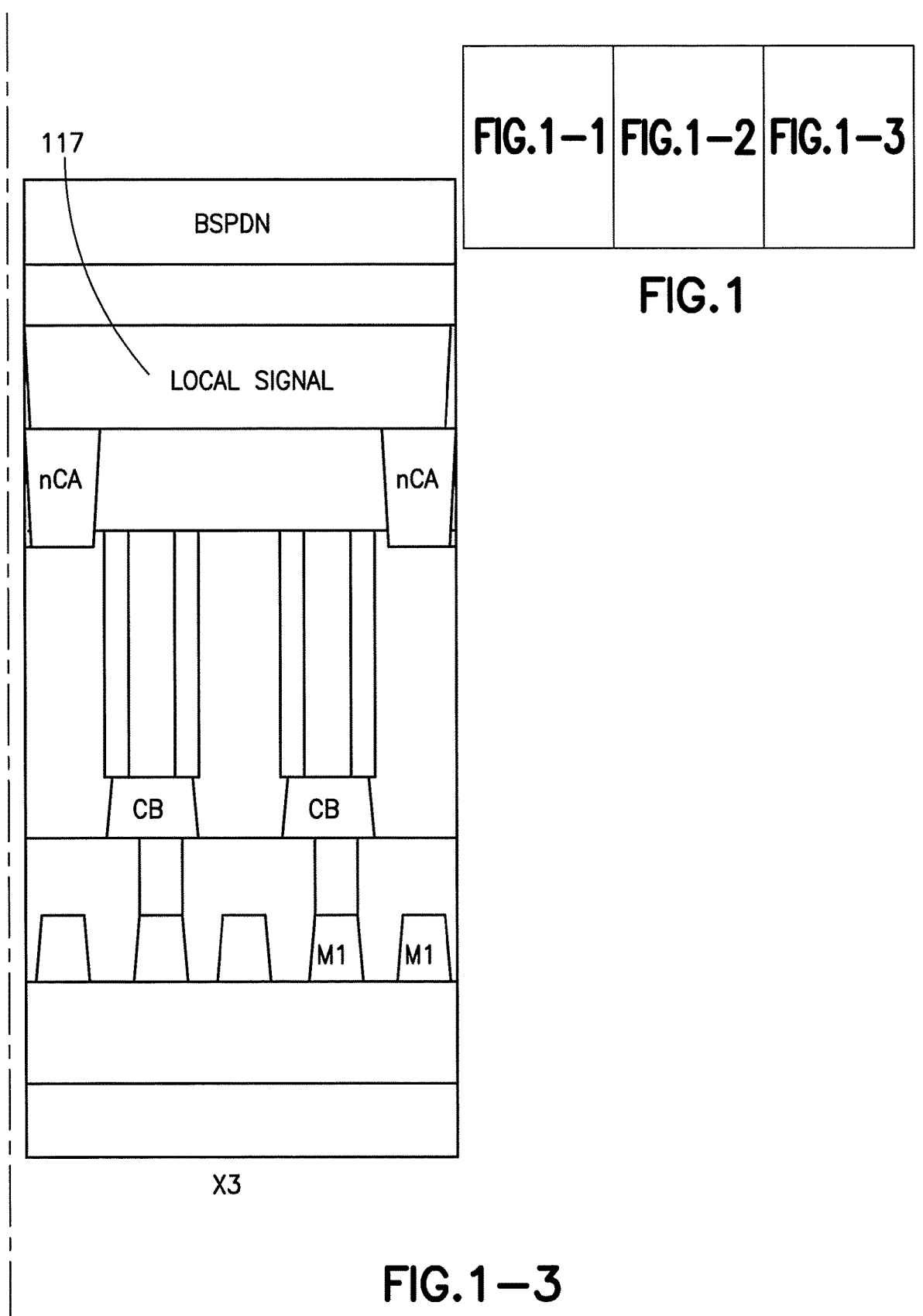
FIG. 1 depicts a semiconductor device, formed based on the examples described herein.

Referring to FIG. 1, described herein is a semiconductor device 100 that includes backside power rails (106, 108, 110) located between N2N spaces (102) and P2P spaces (104). The semiconductor device 100 includes backside local signal lines (112, 114) located between the backside power rails (106, 108, 110). Backside power rails (106, 108, 110) of the semiconductor device 100 connect to S/D epitaxies through backside contacts. Backside local signal lines (112, 114, 116) of the semiconductor device 100 connect to the source/drain epitaxy or gate (124) through a backside contact (126). The semiconductor device 100 comprises a standard cell architecture with local signal lines (112, 114, 116, 117) running horizontally on the backside, and the first frontside metal running vertically. Also shown in FIG. 1 are transistors 113, N2P spaces (105), N channel field effect transistor regions or spaces (504, 506, 512, 514), and P channel field effect transistor regions or spaces (508, 510).

As the cell height is shortened while keeping the same number of metal layer 0 (M0) signal tracks, the M0 pitch is reduced, i.e. from 28 to 24 to 18 to 16. The tighter M0 pitch has narrower metal and a smaller via which has higher resistance. Since the circuit output nodes are connected through these higher resistance metals and vias, the circuit delay is being impacted. The structure described herein relates to a standard cell architecture utilizing backside metal to reduce this high resistance bottleneck.

Figure 2:
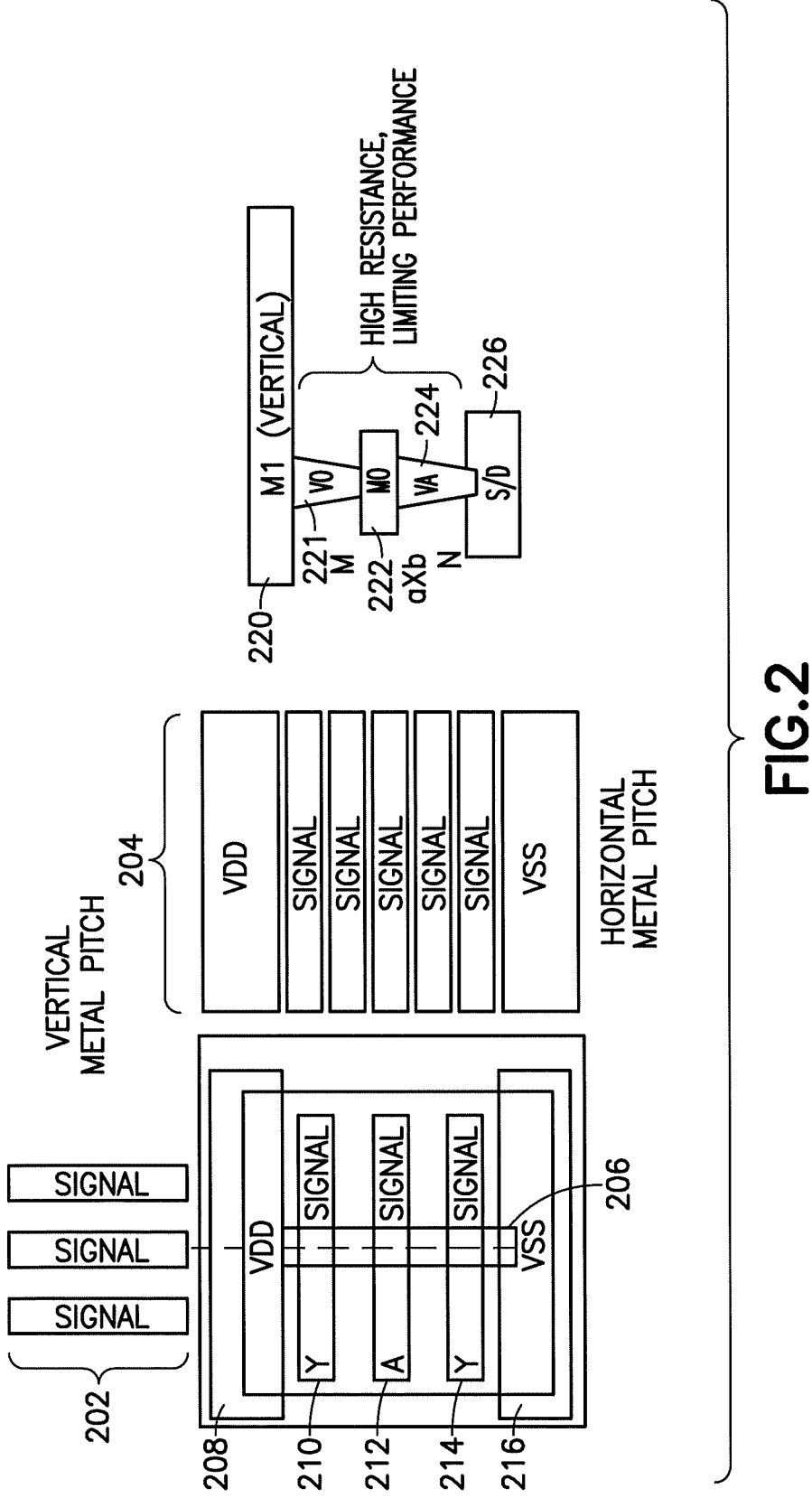
FIG. 2 depicts a vertical metal pitch and horizontal metal pitch.

FIG. 2 depicts a high performance cell architecture with back side metal. In particular, FIG. 2 depicts a vertical metal pitch (202) of a given dimension (e.g. in nm) and horizontal metal pitch (204) of a given dimension (e.g. in nm). Vertical metal pitch 202 includes at least signal 206. Horizontal metal pitch 204 includes at least source/drain supply voltage 208, signal 210, signal 212, signal 214, and source/drain supply voltage 216. As an example, given the configuration shown in FIG. 2, with metal layer 220 connected with via 221 to metal layer 222, which is connected to source/drain 226 with via 224, M0P is a given dimension (e.g. in nm), and M1P is a given dimension (e.g. in nm). If the voltage between metal layer 220 and metal layer 222 is a given value M (e.g. in Ω), and the voltage between metal layer 222 and source/drain 226 is a given value N (e.g. in Ω), where the via 224 has a size of a×b for values a and b, there is high resistance and limiting performance.

Figure 3:
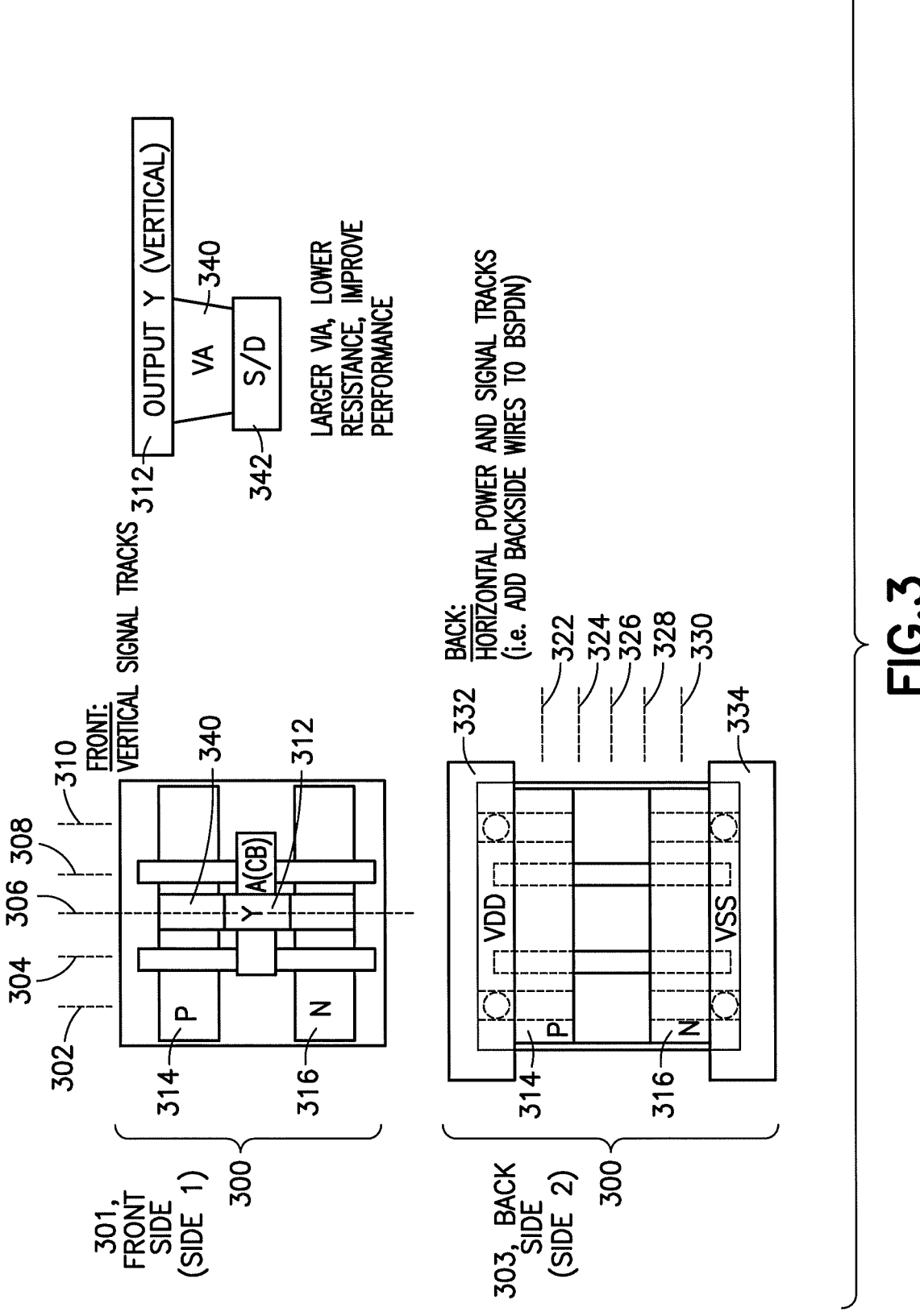
FIG. 3 depicts an n-track cell height with backside routing (INV_X2 example)

FIG. 3 depicts a high performance cell architecture with back side metal. In particular, FIG. 3 depicts an n-track cell height with backside routing (INV_X2 example). Shown are vertical signal tracks (302, 304, 306, 308, 310) on the front side 301, with output Y 312 along vertical signal track 306. The wafer 300 includes a p-channel 314 and an n-channel 316. The backside 303 of the wafer 300 includes horizontal power and signal tracks (322, 324, 326, 328, 330), used to for example add backside wires to a backside power distribution network. Shown also are source/drain supply voltages (332, 334). FIG. 3 further shows the configuration where output Y 312 is coupled to source/drain 342 with via 340. In this case, a larger via 340 results in lower resistance and improved performance. If the size of the via 340 is s×t for values s and t, the resistance is given with a value (e.g. in Ω).

Figure 4:
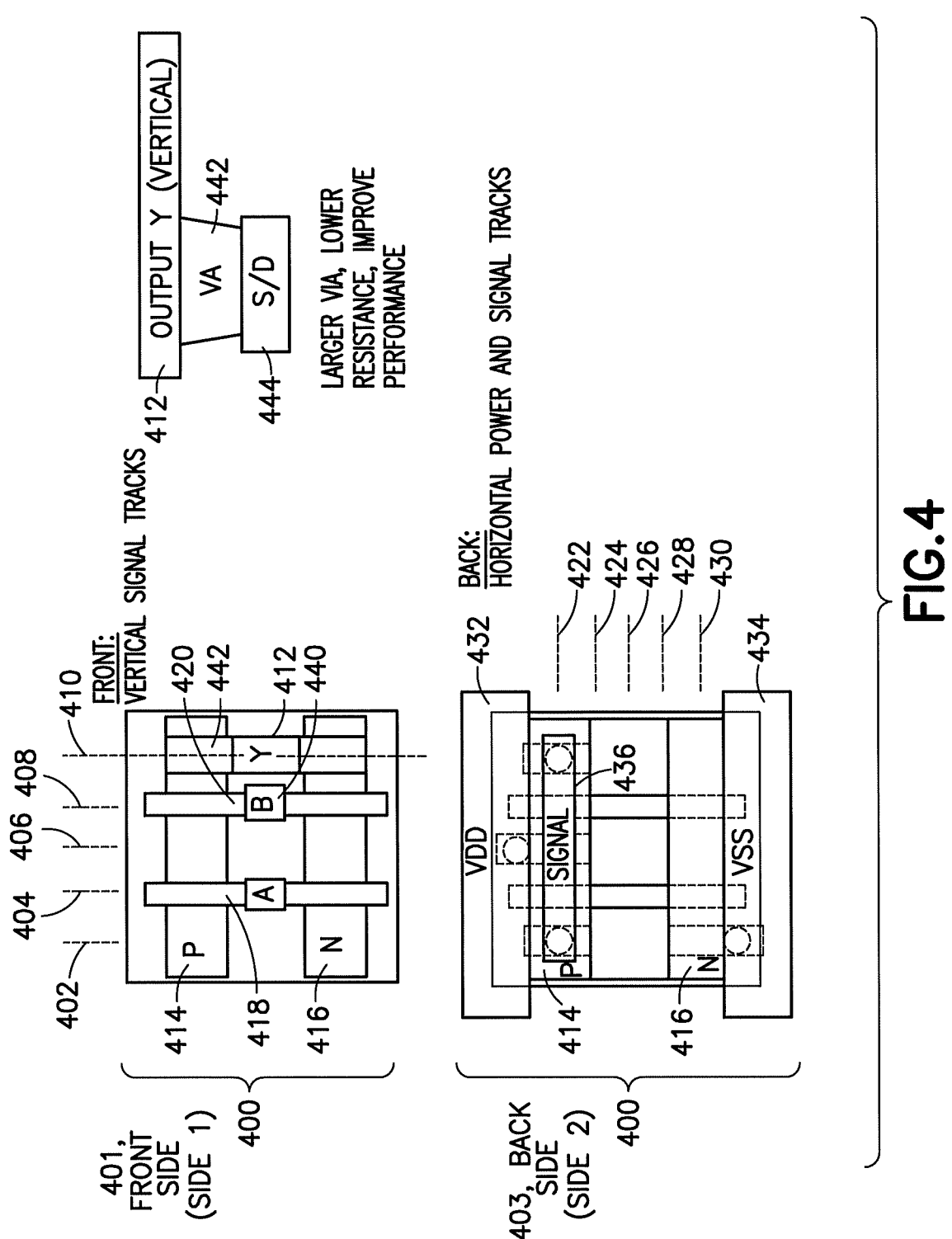
FIG. 4 depicts an n-track cell height with backside routing (NAND2_X1 example)

FIG. 4 depicts an n-track cell height with backside routing (NAND2_X1 example). Shown are vertical signal tracks (402, 404, 406, 408, 410) on the front side 401, with output Y 412 along vertical signal track 410. The wafer 400 includes a p-channel 414 and an n-channel 416. Signal line 420 and via 440 are along signal track 408, and signal line 418 and via 442 are along track 404. The backside 403 of the wafer 400 includes horizontal power and signal tracks (422, 424, 426, 428, 430), used to for example add backside wires to a backside power distribution network. Signal line 436 is along track 422. Shown also are source/drain supply voltages (432, 434). FIG. 4 further shows the configuration where output Y 412 is coupled to source/drain 444 with via 442. In this case, a larger via 442 results in lower resistance and improved performance. If the size of the via 442 is i×j for values i and j, the resistance is given with a value (e.g. in Ω).

FIGS. 5 to 17 depict an example process flow for forming a semiconductor device or integrated circuit, based on the examples described herein.

Figures 5A, 5B:
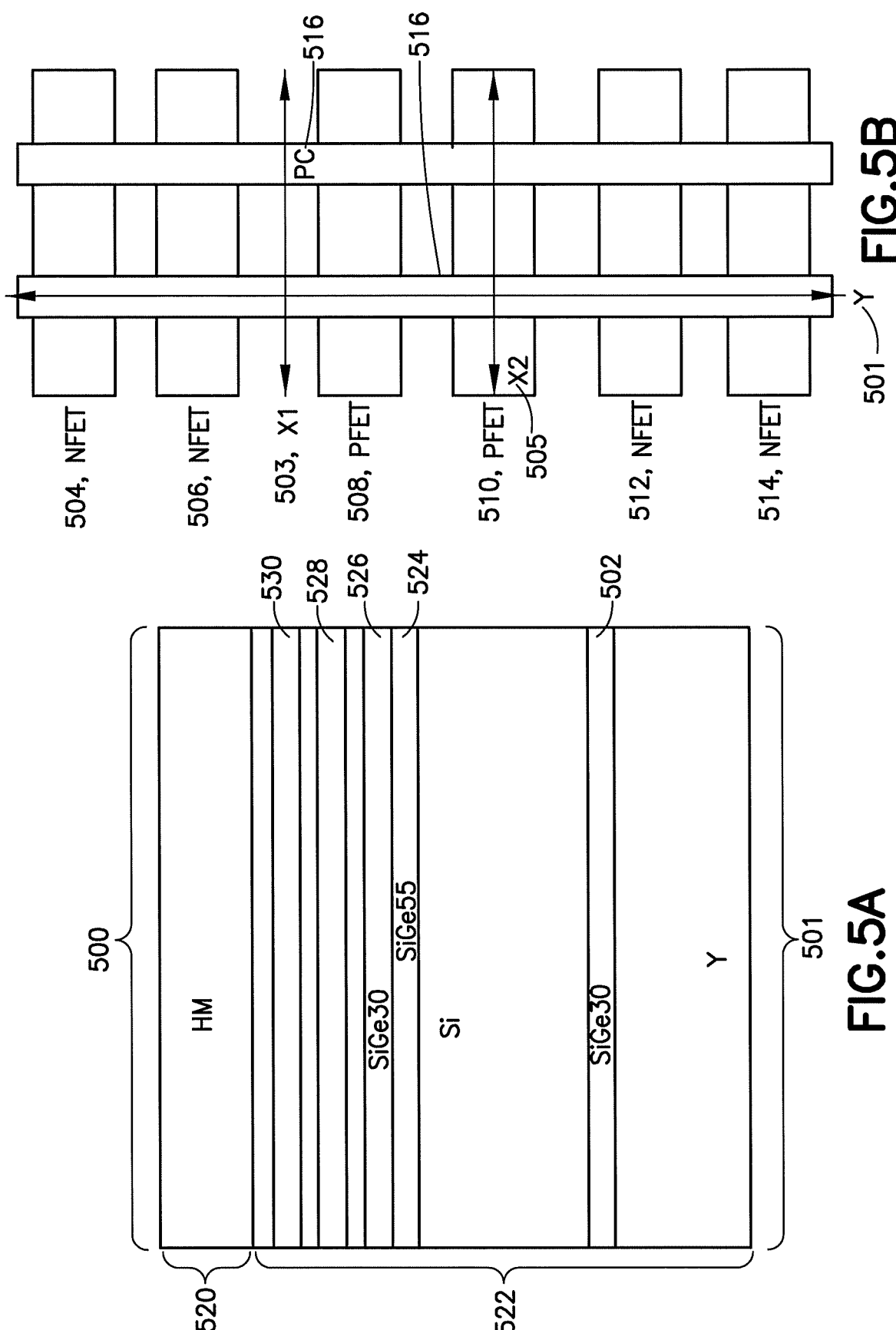
FIG. 5A depicts a cross-section view of a starting wafer for an integrated circuit.
FIG. 5B shows a top down view including cuts of the integrated circuit.

FIG. 5A depicts a starting wafer 500 for the integrated circuit, in particular the Y cut 501. If the SiGe30 layer 502, also known as the etch stop layer 502, cannot stop substrate removal, the SiGe30 layer 502 can also (e.g. alternatively) be BOX SiO2. The Y cut 501 includes a hard mask 520, a silicon layer 522, SiGe30 layers (502, 526, 528, 530) within the silicon layer 522, and an SiGe55 layer (524) within the silicon layer 522. The layer 524 may also be an SiGe60 layer.

FIG. 5B shows a top down view of the integrated circuit, including cut lines for the Y cut 501, the X1 cut 503, and the X2 cut 505. FIG. 5B also shows N channel field effect transistor regions (504, 506, 512, 514), P channel field effect transistor regions (508, 510), and gates (516). In FIG. 5B, X1 and X2 are cut lines relating the top down view of FIG. 5B with the cross-section view of FIG. 5A. In FIG. 5B, Y shows the cut line to cross-section.

Figures 6A, 6B:
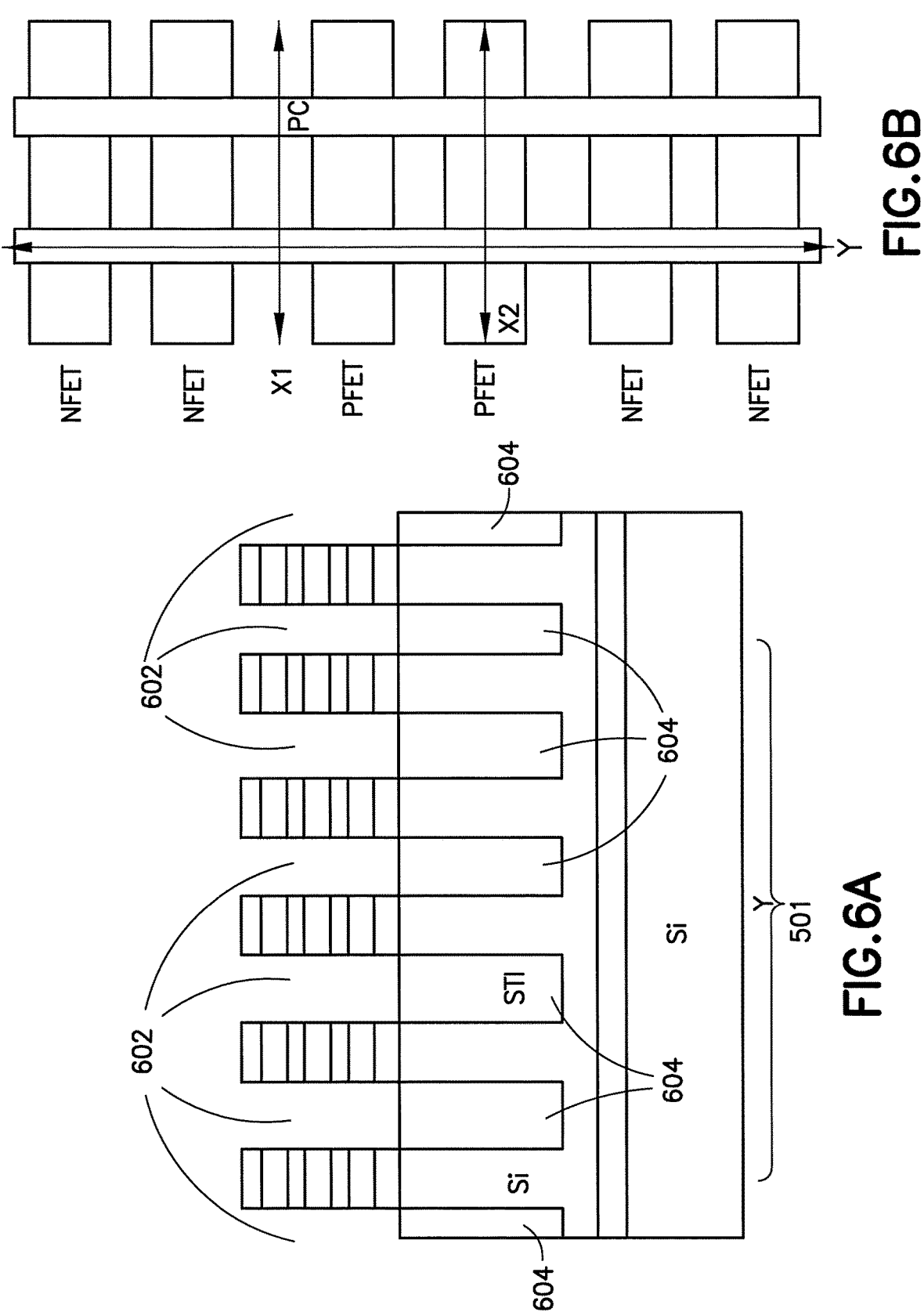
FIG. 6A depicts a cross-section view of the integrated circuit after nanosheet (NS) patterning and shallow trench isolation (STI) formation.
FIG. 6B depicts a top down view including cuts of the integrated circuit.

FIG. 6A depicts the Y cut 501 of the integrated circuit after nanosheet (NS) patterning and shallow trench isolation (STI) formation, and FIG. 6B depicts a top down view of the integrated circuit including cut lines for cuts Y 501, X1 503, and X2 505 of the integrated circuit. Nanosheet patterning includes removal of the hard mask 520 and formation of etches 602 within the silicon layer 522, SiGe30 layers (526, 528, 530), and SiGe55 layer 524. The shallow trench isolation 604 is formed within the silicon layer 522 under etches 602 and above SiGe30 layer 502. In FIG. 6B, X1 and X2 are cut lines relating the top down view of FIG. 6B with the cross-section view of FIG. 6A. In FIG. 6B, Y shows the cut line to cross-section.

Figures 7A, 7B:
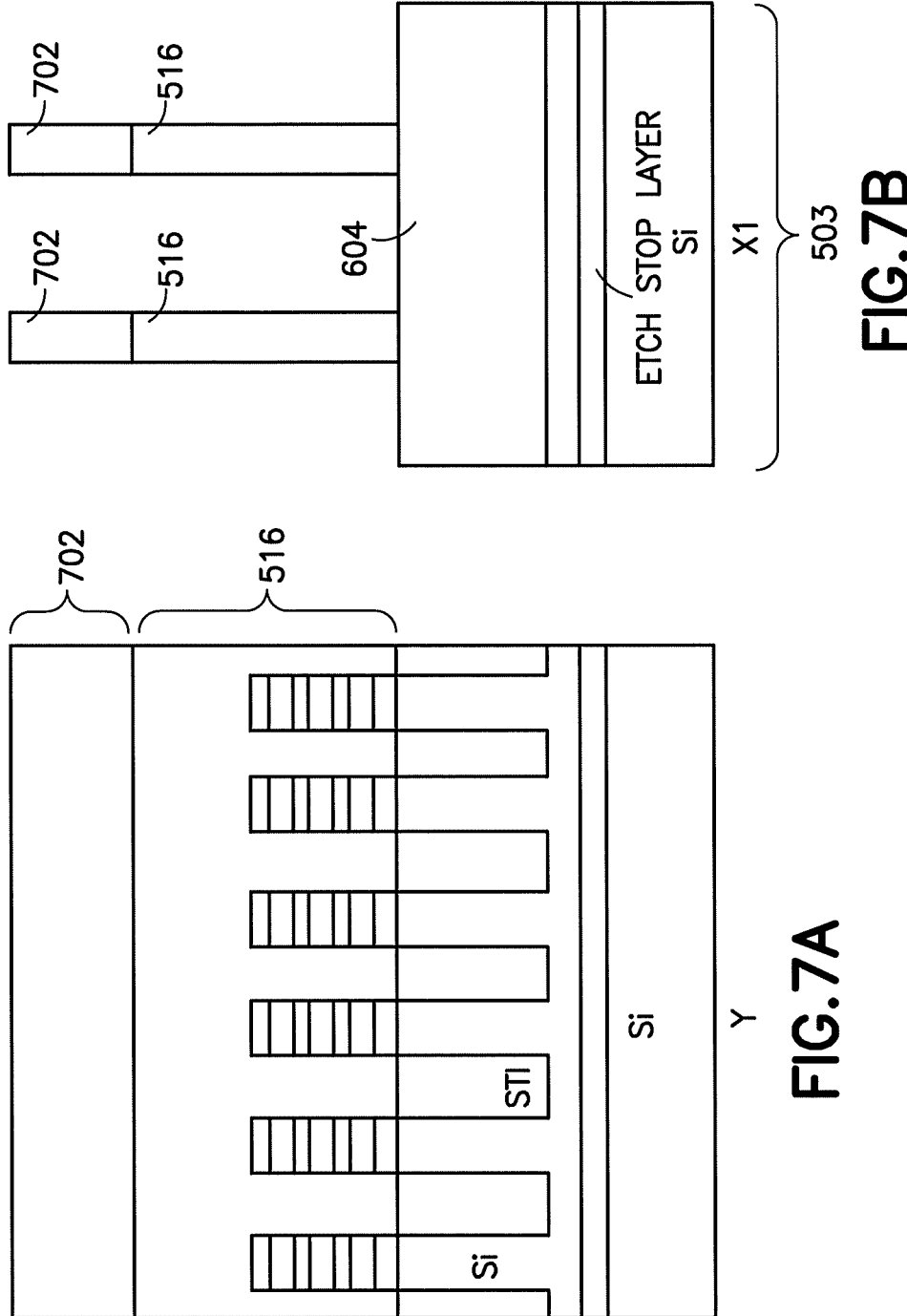
FIG. 7A, FIG. 7B, and FIG. 7C each depict a cross-section view of the integrated circuit after gate formation.
Figure 7D:
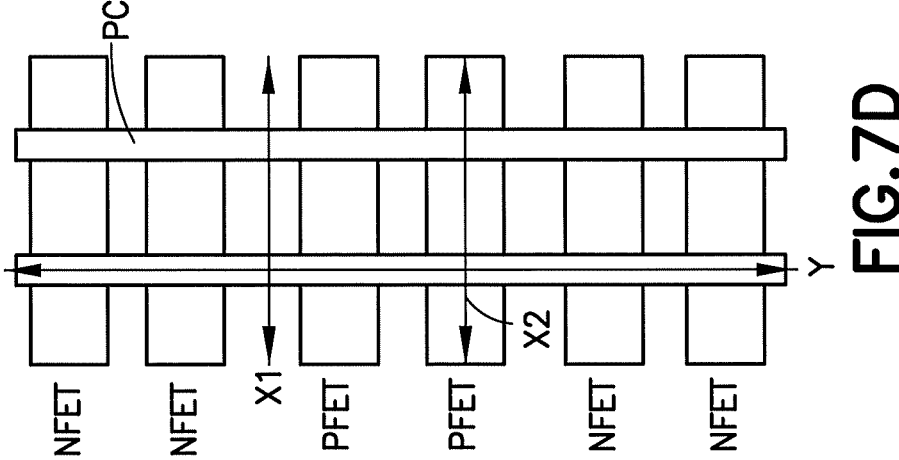
FIG. 7D shows a top down view of the integrated circuit including cut lines (Y, X1, and X2, respectively) relating the top down view with the cross-section views shown in FIGS. 7A, 7B, and 7C.
Figure 7C:
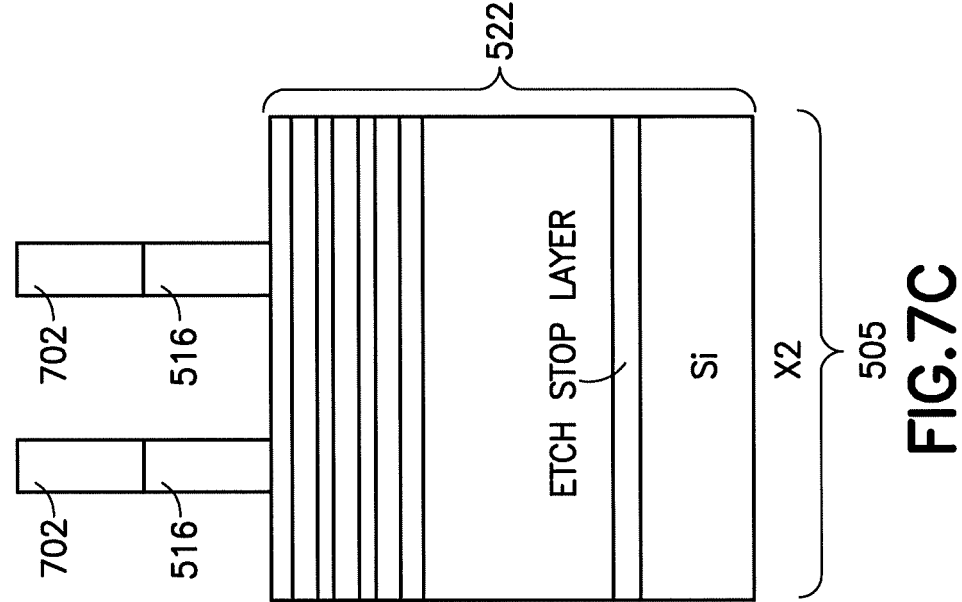

FIG. 7A depicts the Y cut 501 cross-sectional view of the integrated circuit after gate formation. FIG. 7B depicts the X1 cut 503 cross-sectional view of the integrated circuit after gate formation. FIG. 7C depicts the X2 cut 505 cross-sectional view of the integrated circuit after gate formation. In the Y cut 501, gate 516 is formed within and above etches 602, and to contact the shallow trench isolation layer 604. A nanosheet layer 702 is formed above the gate 516. FIG. 7B shows that in the X1 cut 503, the gates (516) are formed above the shallow trench isolation layer 604, and the nanosheet layer 702 is formed above the gates (516). FIG. 7C shows that in the X2 cut 505, the gates (516) are formed above the silicon layer 522, and the nanosheet layer 702 is formed above the gates (516). FIG. 7D shows a top down view of the integrated circuit including cut lines for cuts Y 501, X1 503, and X2 505 shown in FIG. 7A, FIG. 7B, and FIG. 7C, respectively. In FIG. 7D, X1 and X2 are cut lines relating the top down view of FIG. 7D with the cross-section views of FIG. 7A, FIG. 7B, and FIG. 7C. In FIG. 7D, Y shows the cut line to cross-section.

Figures 8A, 8B:
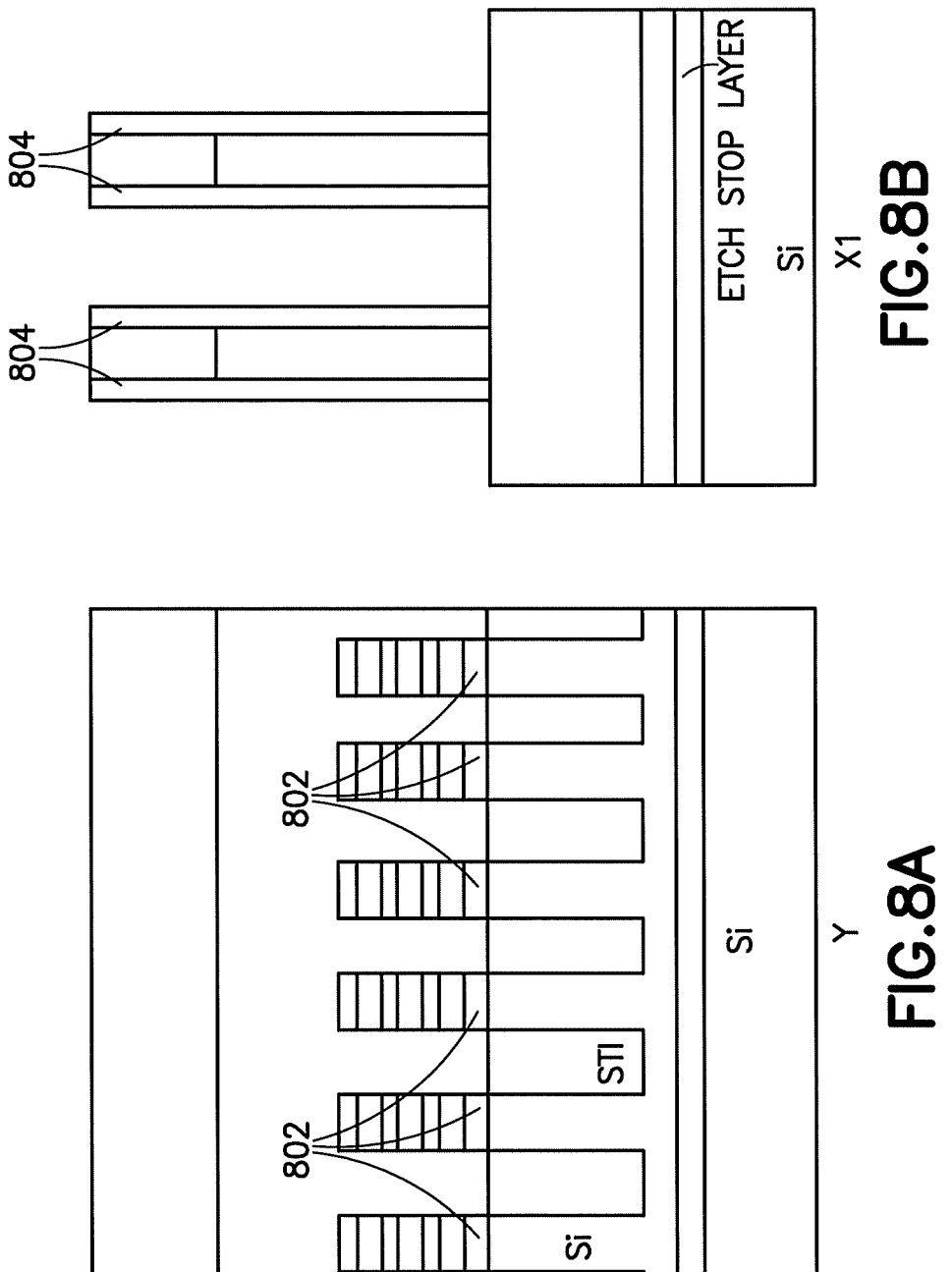
FIG. 8A, FIG. 8B, and FIG. 8C each depict a cross-section view of the integrated circuit after SiGe (e.g. SiGe60) removal, spacer formation, and bottom dielectric isolation (BDI) formation.
Figure 8D:
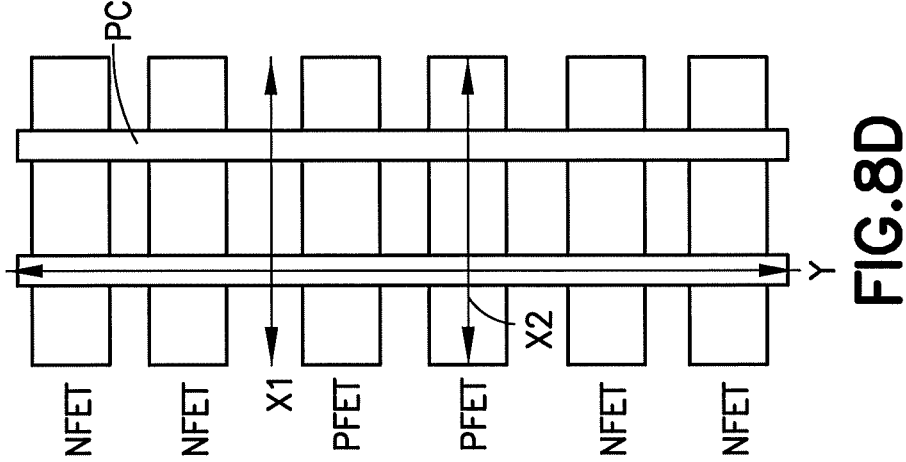
FIG. 8D shows a top down view of the integrated circuit including cut lines (Y, X1, and X2, respectively) relating the top down view with the cross-section views shown in FIGS. 8A, 8B, and 8C.
Figure 8C:
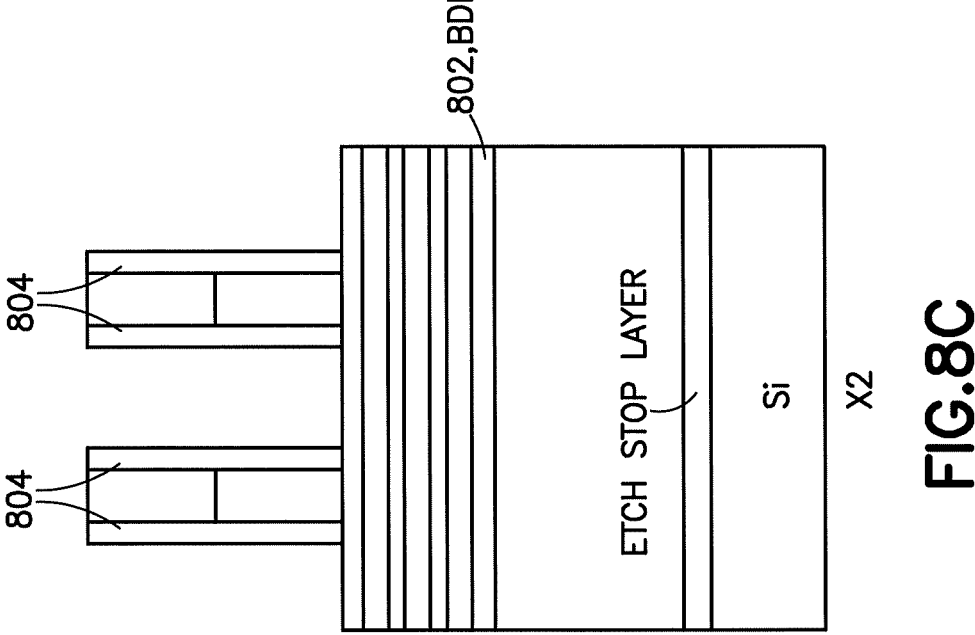

FIG. 8A, FIG. 8B, and FIG. 8C each depict a cut (Y 501, X1 503, X2 505, respectively) of the integrated circuit after removal of the SiGe60 layer 524, spacer formation, and formation of bottom dielectric isolation (BDI) 802. In the Y cut 501, the bottom dielectric isolation 802 is formed in place of the removed SiGe60 layer 524. In the X1 cut 503, a spacer 804 is formed along the sides of the gates (516) and the nanosheet layer 702. In the X2 cut 503, the bottom dielectric isolation 802 is formed in place of the removed SiGe60 layer 524, and the spacer is formed along the sides of the gates (516) and the nanosheet layer 702. FIG. 8D shows a view of the cuts (Y 501, X1 503, and X2 505, respectively) shown in FIG. 8A, FIG. 8B, and FIG. 8C. In FIG. 8D, X1 and X2 are cut lines relating the top down view of FIG. 8D with the cross-section views of FIG. 8A, FIG. 8B, and FIG. 8C. In FIG. 8D, Y shows the cut line to cross-section.

Figures 9A, 9B:
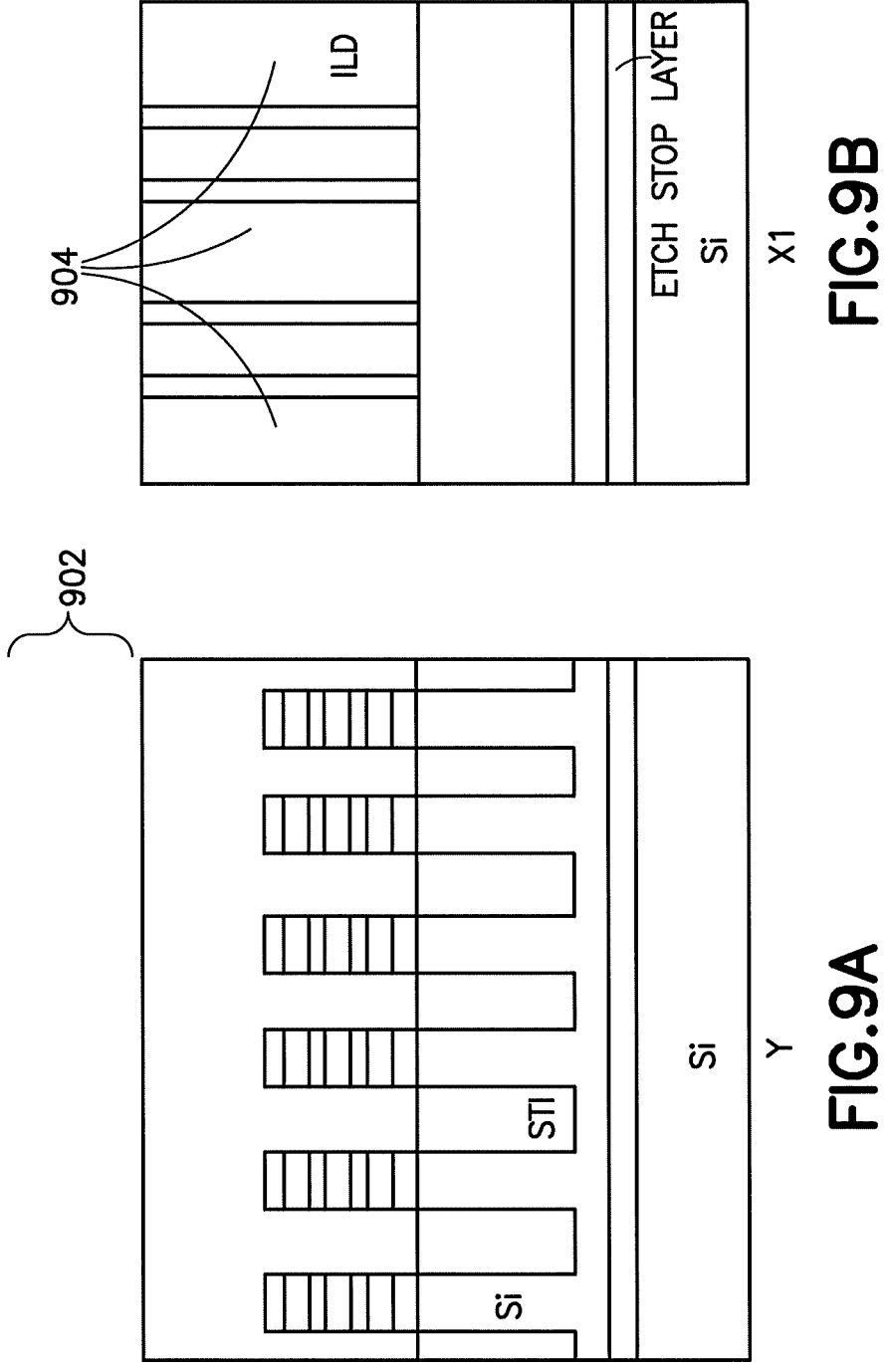
FIG. 9A, FIG. 9B, and FIG. 9C each depict a cross-section view of the integrated circuit after nanosheet (NS) recessing, inner spacer formation, source/drain epitaxy formation, interlayer dielectric deposition and chemical mechanical polishing (CMP)
Figure 9D:
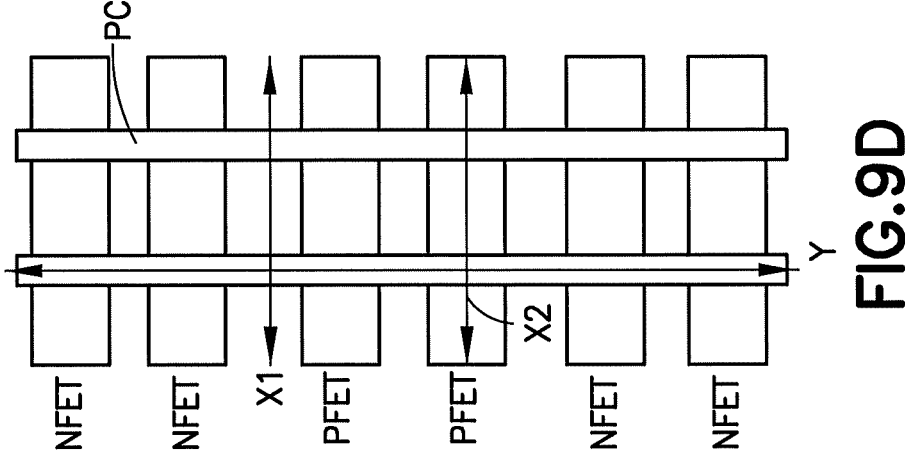
FIG. 9D shows a top down view of the integrated circuit including cut lines (Y, X1, and X2, respectively) relating the top down view with the cross-section views shown in FIGS. 9A, 9B, and 9C.
Figure 9C:
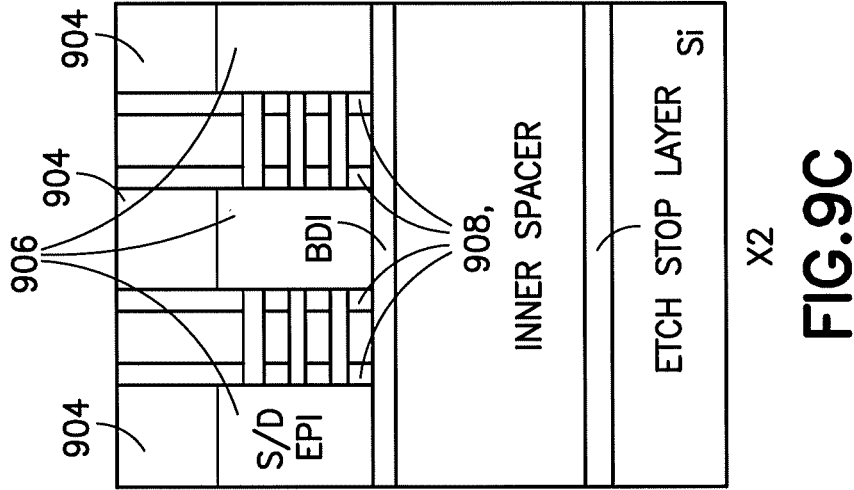

FIG. 9A depicts the Y cut 501 after recessing of the nanosheet layer 702 (depicted as 902) and chemical and mechanical polishing. FIG. 9B shows the X1 cut 503 after deposition of the interlayer dielectric 904, where the interlayer dielectric 904 is deposited along the sides of the spacer 804 and above the shallow trench isolation 604, and after chemical and mechanical polishing. FIG. 9C shows the X2 cut 505 after formation of the interlayer dielectric 904 above the bottom dielectric isolation 802 and the sides of spacer 804, and formation of the source/drain epitaxy 906 within the interlayer dielectric 904 above the bottom dielectric isolation 802 and sides of spacer 804. FIG. 9C further shows formation of inner spacer 908 between the source/drain epitaxy 906 above the bottom dielectric isolation 802, under the spacer 804 and gates (516), and between portions of the silicon layer 522, and along sides of portions of SiGe30 layers (526, 528, 530). The operations performed in the context of FIG. 9C may also include chemical and mechanical polishing. FIG. 9D shows a view of the cuts (Y 501, X1 503, and X2 505, respectively) shown in FIGS. 9A, 9B, and 9C. In FIG. 9D, X1 and X2 are cut lines relating the top down view of FIG. 9D with the cross-section views of FIG. 9A, FIG. 9B, and FIG. 9C. In FIG. 9D, Y shows the cut line to cross-section.

Figures 10A, 10B:
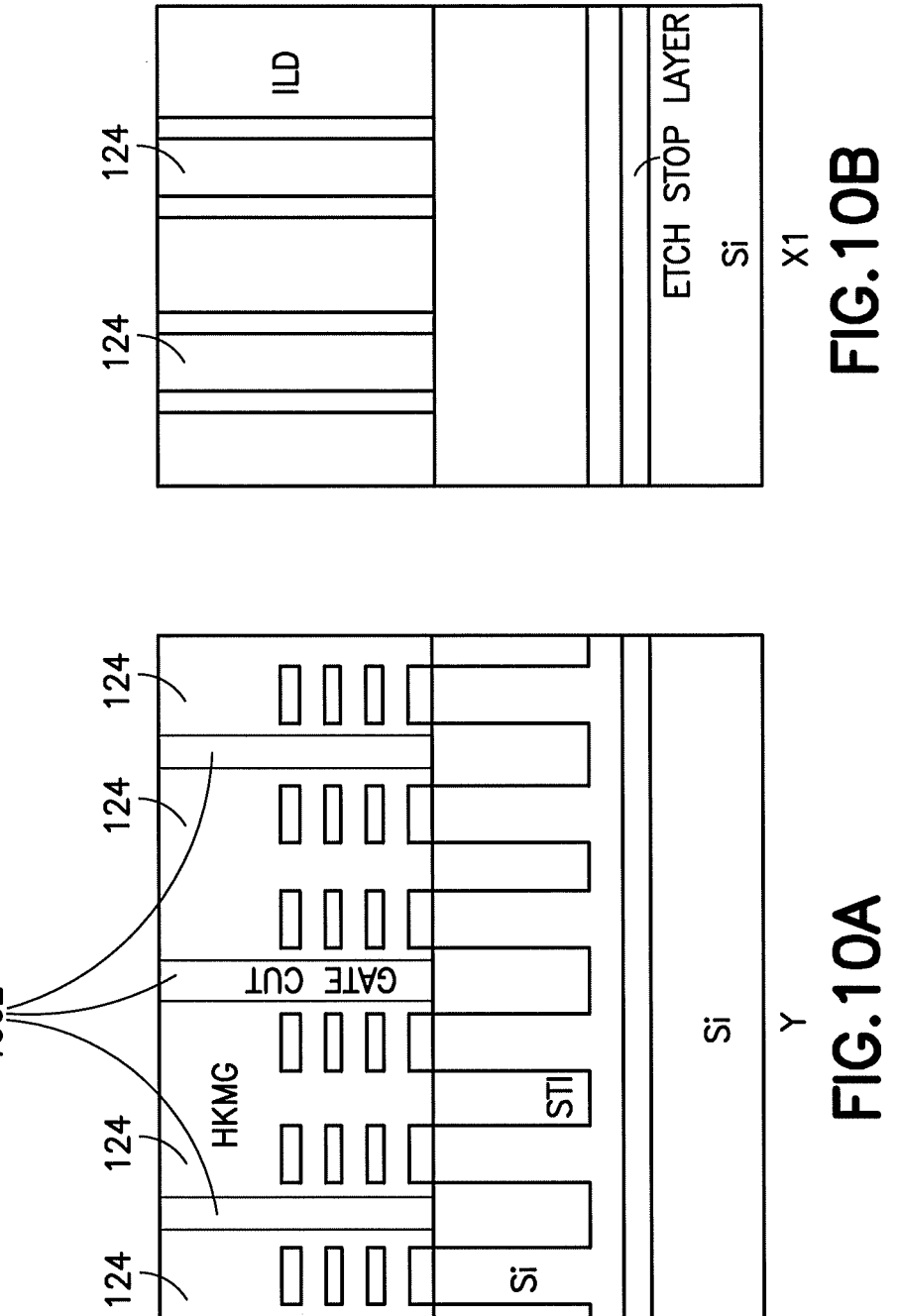
FIG. 10A, FIG. 10B, and FIG. 10C each depict a cross-section view of the integrated circuit after gate cut formation, gate removal, SiGe release, and high-k metal gate (HKMG) formation.
Figure 10D:
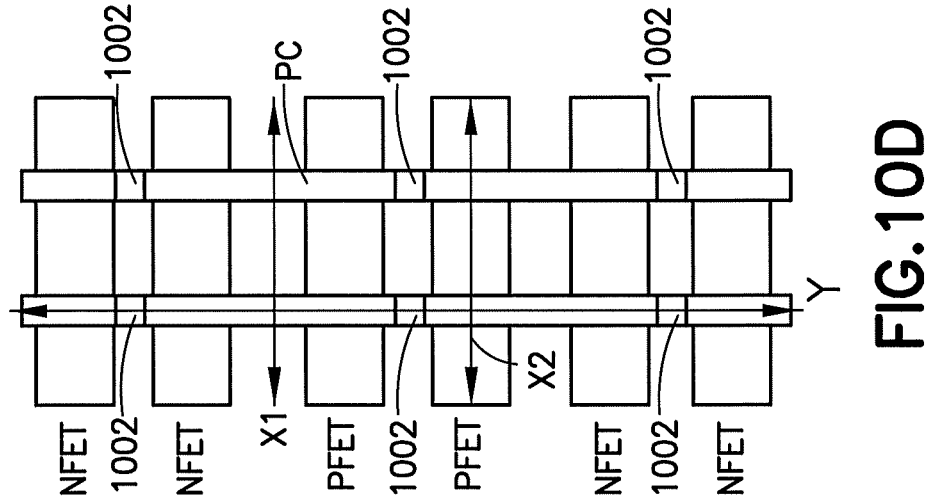
FIG. 10D shows a top down view of the integrated circuit including cut lines (Y, X1, and X2, respectively) relating the top down view with the cross-section views shown in FIGS. 10A, 10B, and 100.
Figure 10C:
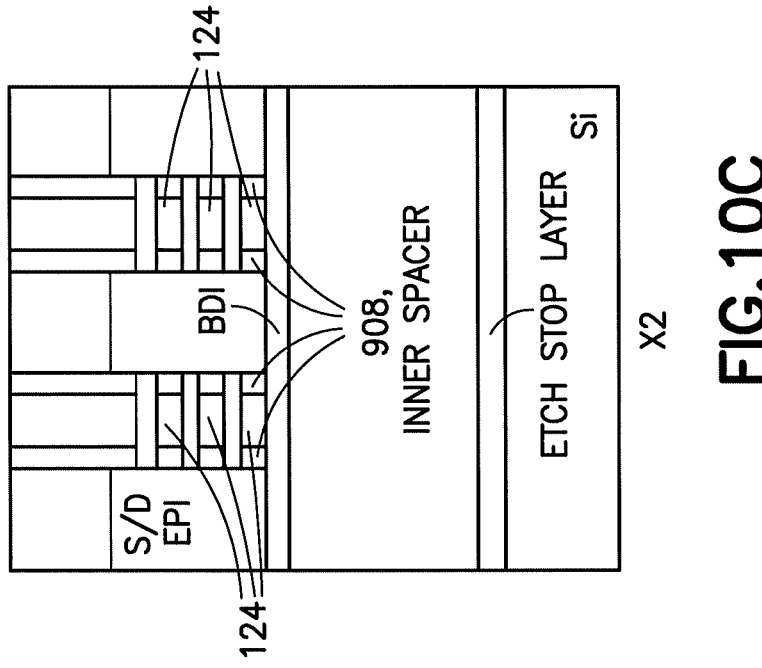

FIG. 10A, FIG. 10B, and FIG. 10C each depict a cut of the integrated circuit after gate cut formation, gate removal, SiGe release, and high-k metal gate formation. In particular, FIG. 10A shows gate cuts 1002 formed for the Y cut 501 where the gate 516 was removed, and over shallow trench isolation 604. FIG. 10A also shows that the high-k metal gate 124 is formed between the gate cuts 1002 and on at least a portion of the shallow trench isolation 604 and the silicon layer 522, as well as within the regions where the SiGe30 layers (526, 528, 530) were released. FIG. 10B shows that the high-k metal gate 124 for the X1 cut 503 is formed in the regions where the gates (516) were removed. FIG. 10C shows that the high-k metal gate 124 for the X2 cut 505 is formed in the region where the gates (516) were removed, and where the SiGe30 layers (526, 528, 530) were released between the silicon layer 522, as well as between the inner spacer 908, between spacer 804, and over the bottom dielectric isolation 802. FIG. 10D shows a view of the cuts (Y 501, X1 503, and X2 505, respectively) shown in FIG. 10A, FIG. 10B, and FIG. 10C. FIG. 10D shows that the gate cuts 1002 are formed between N channel field effect transistor regions 504 and 506, P channel field effect regions 508 and 510, and N channel field effect transistor regions 512 and 514. In FIG. 10D, X1 and X2 are cut lines relating the top down view of FIG. 10D with the cross-section views of FIG. 10A, FIG. 10B, and FIG. 10C. In FIG. 10D, Y shows the cut line to cross-section.

Figure 11B:
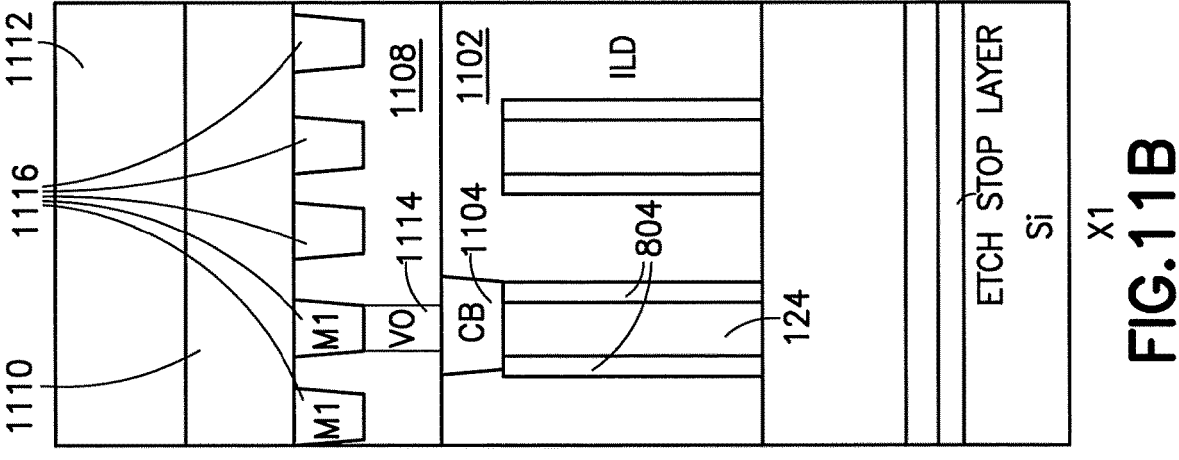
FIG. 11A, FIG. 11B, and FIG. 11C each depict a cross-section view of the integrated circuit after forming a middle of line (M0L) contact, back end of line (BEOL) formation, and carrier wafer bonding.
Figure 11A:
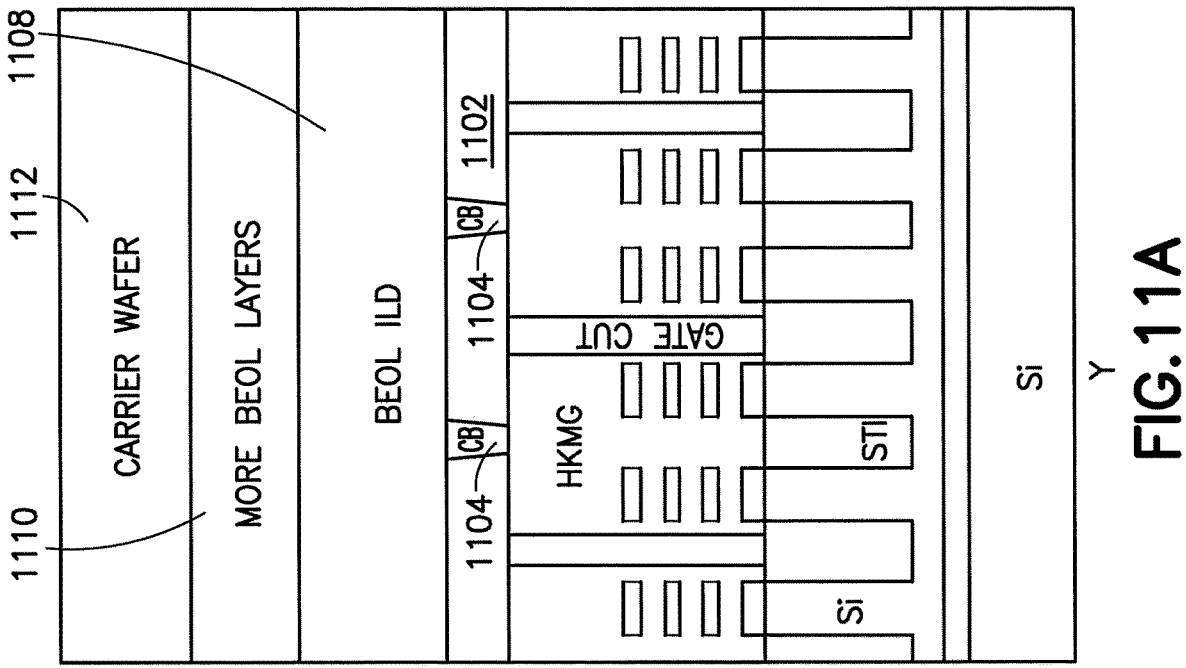
Figure 11D:
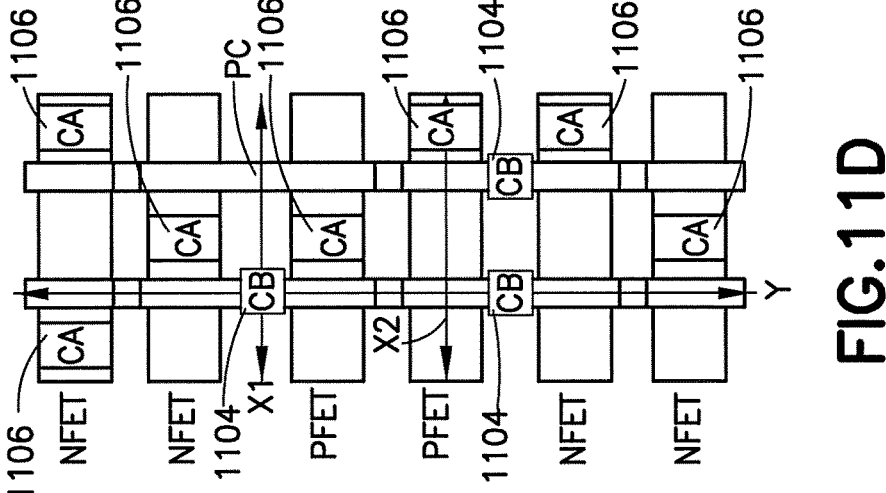
FIG. 11D shows a top down view of the integrated circuit including cut lines (Y, X1, and X2, respectively) relating the top down view with the cross-section views shown in FIGS. 11A, 11B, and 11C.
Figure 11C:
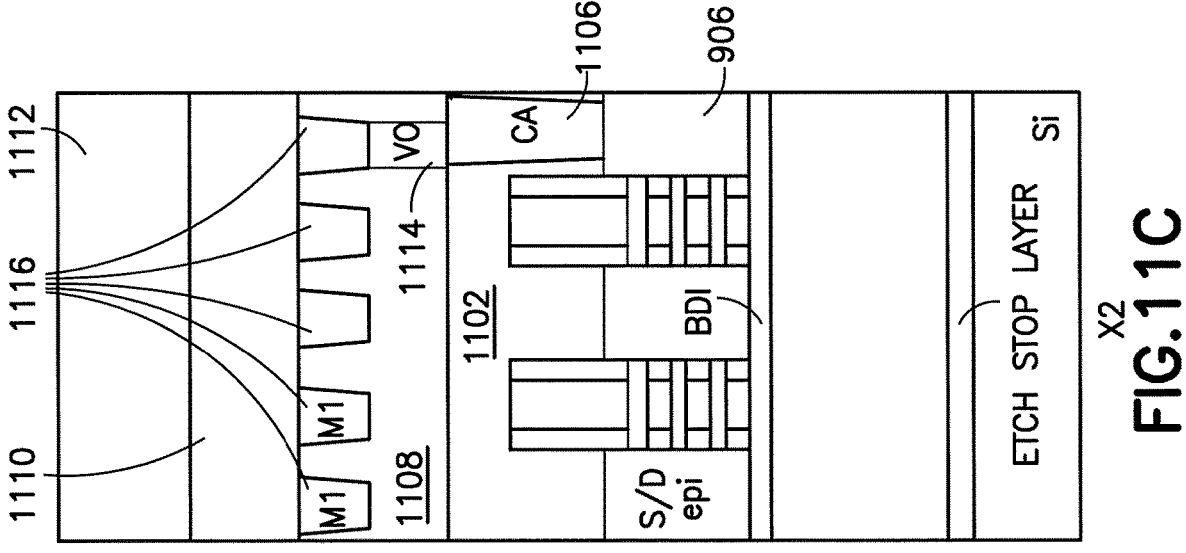

FIG. 11A, FIG. 11B, and FIG. 11C each depict a cut of the integrated circuit after forming an MOL contact, BEOL formation, and carrier wafer bonding.

FIG. 11A shows that for the Y cut 501, a layer of interlayer dielectric 1102 is applied over the high-k metal gate 124 and gate cuts 1002. Middle of line gate contacts 1104 are formed within the interlayer dielectric 1102 to join the high-k metal gate 124 to a formed back end of line interlayer dielectric 1108. Further for the Y cut 501 more BEOL layers 1110 are formed above the back end of line interlayer dielectric 1108, and a carrier wafer 1112 is formed above the more BEOL layers 1110.

FIG. 11B shows that for the X1 cut 503, the interlayer dielectric 1102 is formed above interlayer dielectric 904, high-k metal gates 124 and spacer 804. Middle of line gate contact 1104 connects one of the high-k metal gates 124 and corresponding spacers 804 to a via 1114 within the back end of line interlayer dielectric 1108, which via 1114 is joined to metal layer 1116 which is joined to the back end of line layers 1110, which is joined to the carrier wafer 1112. As shown in FIG. 11B, for the X1 cut 503 there are a plurality of metal layers 1116 joined to the back end of line layers 1110.

FIG. 11C shows that for the X2 cut 505, the interlayer dielectric 1102 is formed above the source/drain epitaxy 906, high-k metal gates 124 and corresponding spacers 804. Middle of line source/drain contact 1106 connects a source/drain epitaxy (906) to a via 1114 within the back end of line interlayer dielectric 1108 above the interlayer dielectric 1102, which via 1114 is connected to a metal layer 1116 which is connected to the back end of line layers 1110. For the X2 cut 505, a plurality of metal layers 1116 are formed within the interlayer dielectric 1108, which metal layers 1116 are joined to back end of line layers 1110. Within the X2 cut 505, the carrier wafer 1112 is formed above the back end of line layers 1110.

FIG. 11D shows a view of the cuts (Y 501, X1 503, and X2 505, respectively) shown in FIG. 11A, FIG. 11B, and FIG. 11C. FIG. 11D shows that middle of line source/drain contacts 1106 are formed within N channel field effect transistor region 504, a middle of line source/drain contact 1106 is formed within N channel field effect transistor region 506, a middle of line gate contact 1104 is formed between the N channel field effect transistor region 506 and the P channel field effect transistor region 508 and with the gate 516, a middle of line source drain contact 1106 is formed within P channel field effect transistor region 508, a middle of line source/drain contact 1106 is formed within P channel field effect transistor region 510, two middle of line gate contacts (1104) are formed between P channel field effect transistor region 510 and N channel field effect transistor region 512 and on gates (516), a middle of line source/drain contact 1106 is formed within N channel field effect transistor region 512, and a middle of line source/drain contact 1106 is formed within N channel field effect transistor region 514. In FIG. 11D, X1 and X2 are cut lines relating the top down view of FIG. 11D with the cross-section views of FIG. 11A, FIG. 11B, and FIG. 11C. In FIG. 11D, Y shows the cut line to cross-section.

Figures 12A, 12B:
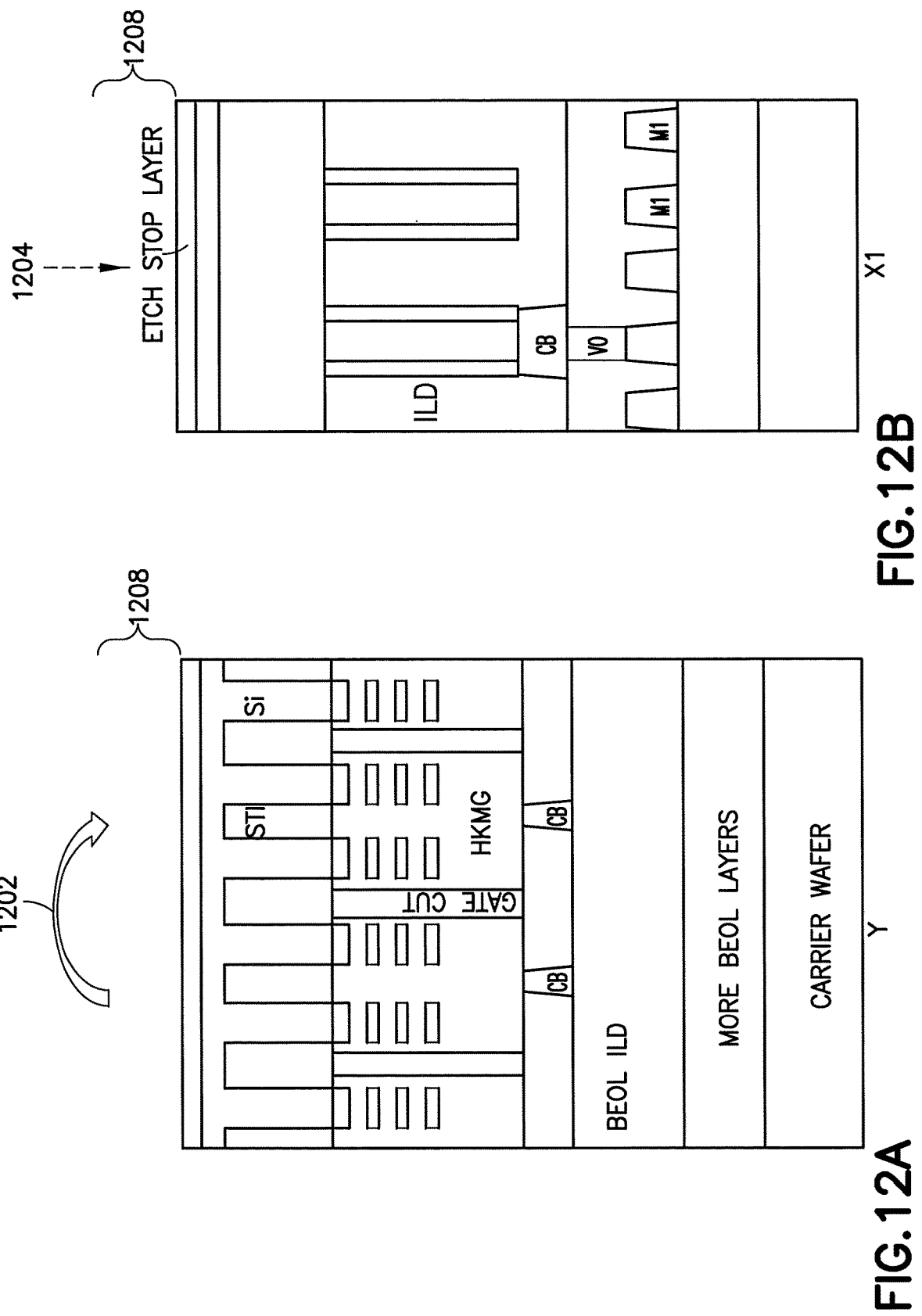
FIG. 12A, FIG. 12B, and FIG. 12C each depict a cross-section view of the integrated circuit after wafer flipping, removing the substrate, and stopping on an etch stop layer.
Figure 12D:
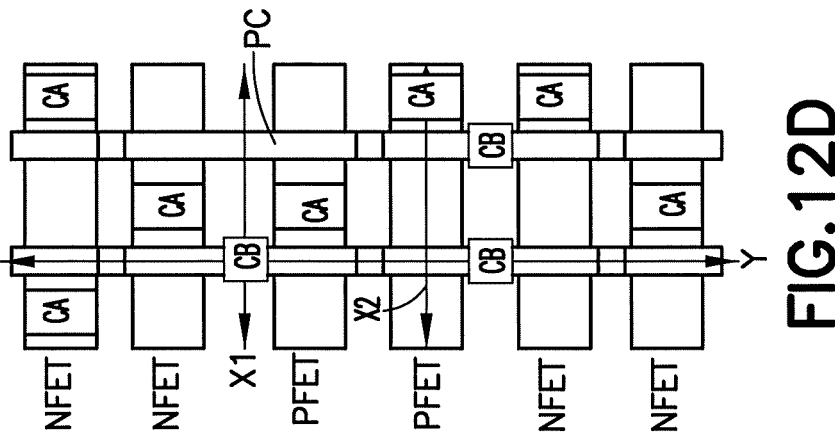
FIG. 12D shows a top down view of the integrated circuit including cut lines (Y, X1, and X2, respectively) relating the top down view with the cross-section views shown in FIGS. 12A, 12B, and 12C.
Figure 12C:
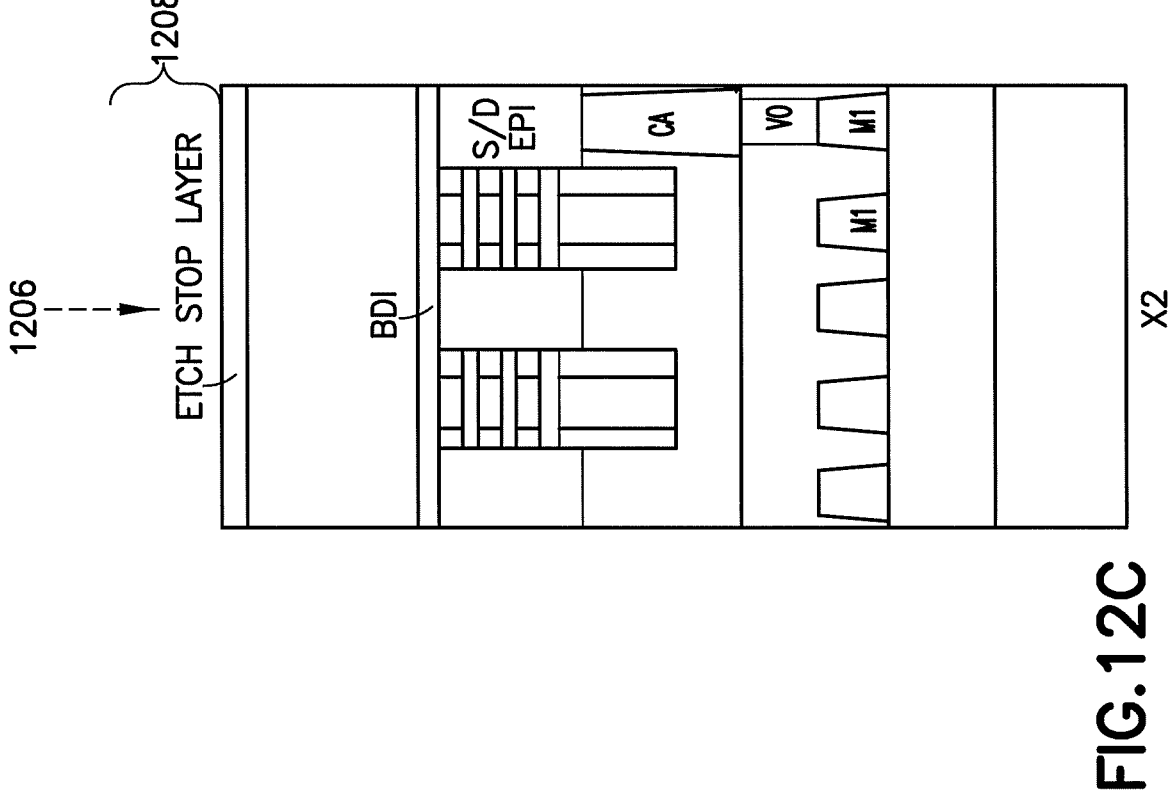

FIG. 12A, FIG. 12B, and FIG. 12C each depict a cut of the integrated circuit after wafer flipping, removing the substrate, and stopping on an etch stop layer. FIG. 12A shows that for the Y cut 501, after the wafer is flipped (1202), the carrier wafer 1112 is at the bottom and the etch stop layer 502 is at the top. Removal of a portion of the substrate 522, stopping at the etch stop layer 502, is depicted as item 1208 for the Y cut 501. FIG. 12B shows that for the X1 cut 503, after the wafer is flipped (1204), the carrier wafer 1112 is at the bottom and the etch stop layer 502 is at the top. Removal of a portion of the substrate 522, stopping at the etch stop layer 502, is depicted as item 1208 for the X1 cut 503. FIG. 12C shows that for the X2 cut 505, after the wafer is flipped (1206), the carrier wafer 1112 is at the bottom and the etch stop layer 502 is at the top. Removal of a portion of the substrate 522, stopping at the etch stop layer 502, is depicted as item 1208 for the X2 cut 505. FIG. 12D shows a view of the cuts (Y 501, X1 503, and X2 505, respectively) shown in FIG. 12A, FIG. 12B, and FIG. 12C. In FIG. 12D, X1 and X2 are cut lines relating the top down view of FIG. 12D with the cross-section views of FIG. 12A, FIG. 12B, and FIG. 12C. In FIG. 12D, Y shows the cut line to cross-section.

Figures 13A, 13B:
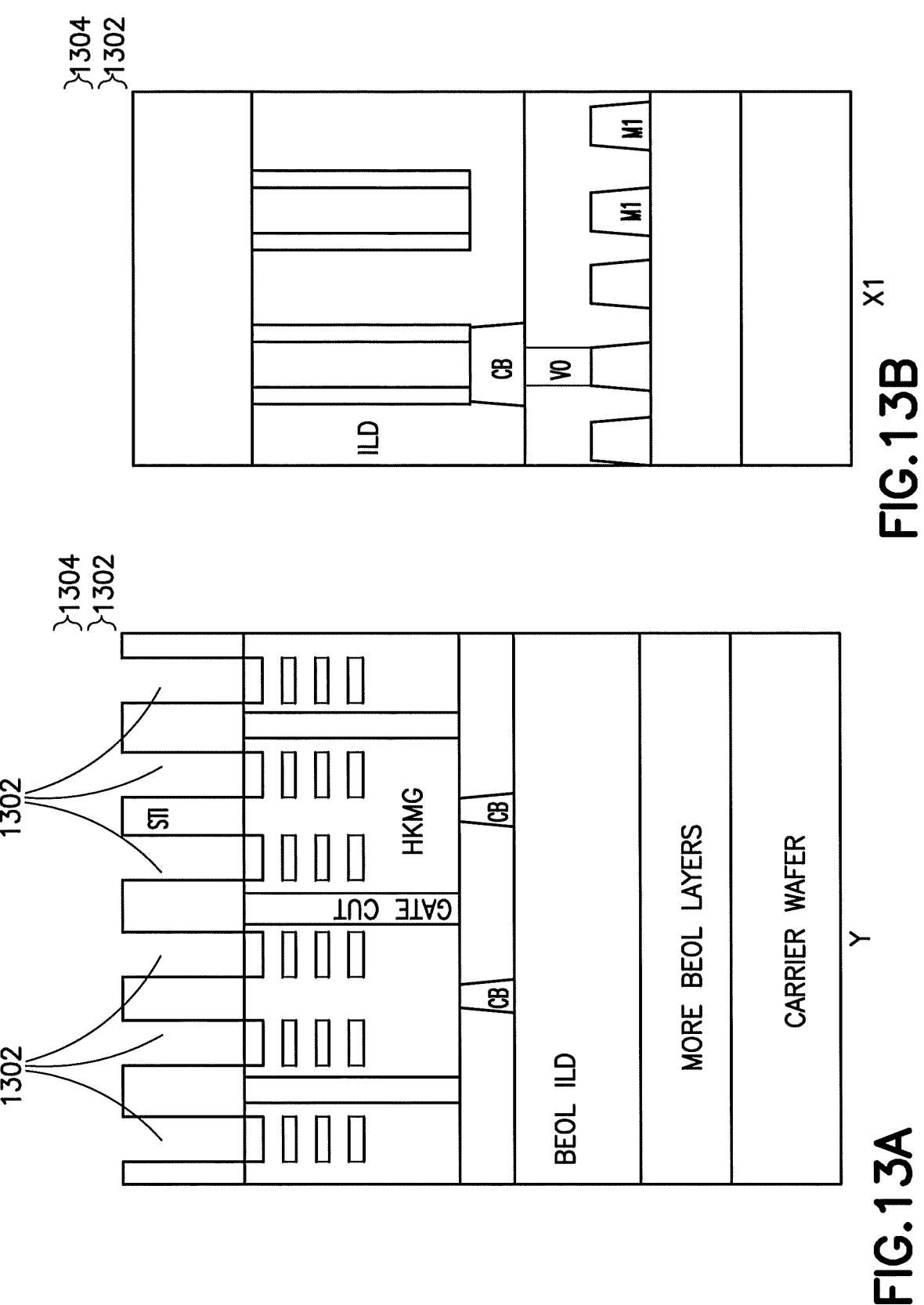
FIG. 13A, FIG. 13B, and FIG. 13C each depict a cross-section view of the integrated circuit after etch stop layer removal and remaining Si removal.
Figure 13D:
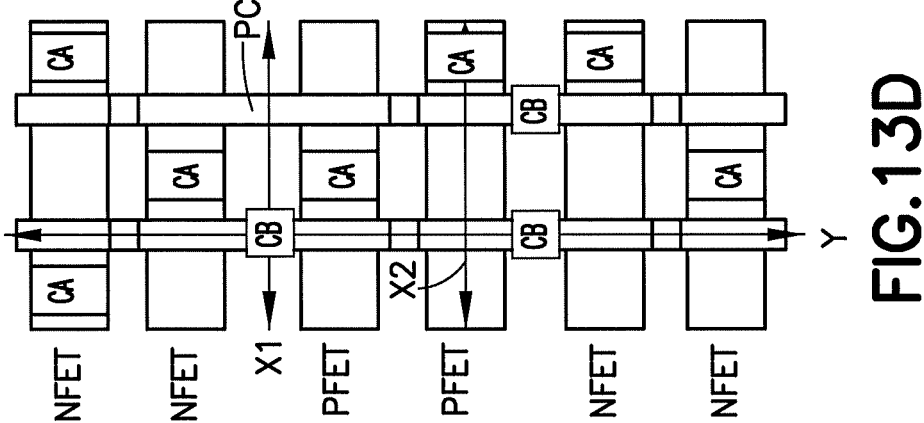
FIG. 13D shows a top down view of the integrated circuit including cut lines (Y, X1, and X2, respectively) relating the top down view with the cross-section views shown in FIGS. 13A, 13B, and 13C.
Figure 13C:
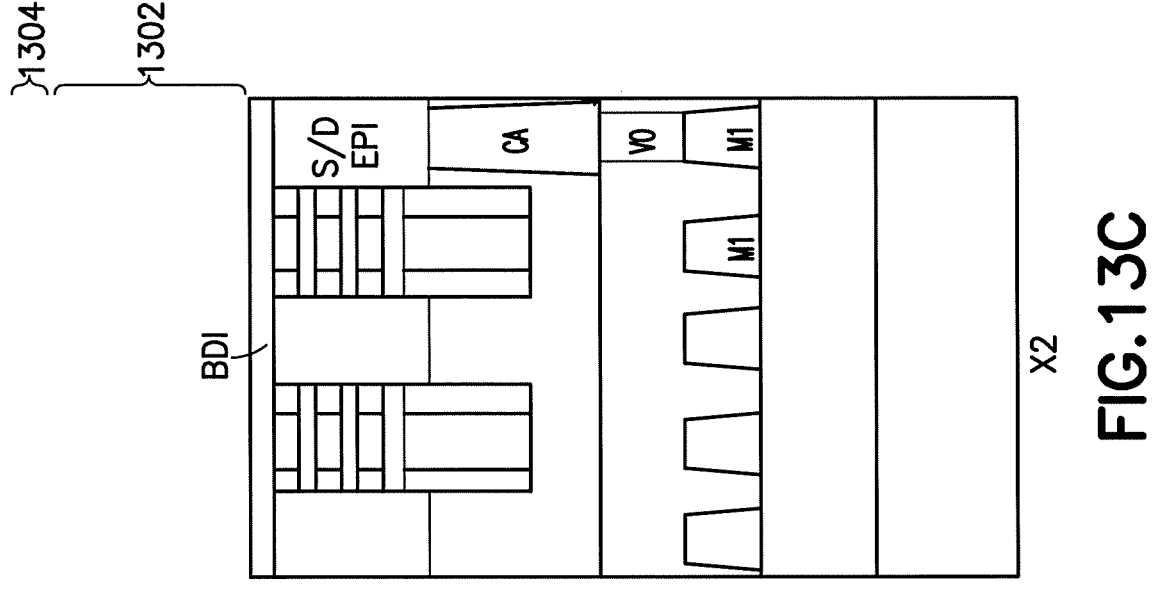

FIG. 13A, FIG. 13B, and FIG. 13C each depict a cut of the integrated circuit after etch stop layer removal and remaining Si removal. FIG. 13A shows that in the Y cut 501, the silicon of silicon layer 522 is removed (depicted as item 1302), including between the shallow trench isolation 604 and above bottom dielectric isolation 802. In the Y cut 501, the etch stop layer 502 is removed (depicted as 1304). FIG. 13B shows that for the X1 cut 503, the silicon of silicon layer 522 is removed (depicted as item 1302) above shallow trench isolation 604. The etch stop layer 502 is also depicted as being removed in the X1 cut 503 (depicted as 1304). FIG. 13C shows that for the X2 cut 505, the silicon 522 is removed above bottom dielectric isolation 802 (depicted as 1302). The etch stop layer 502 is also depicted as being removed in the X2 cut 505 (depicted as 1304). FIG. 13D shows a view of the cuts (Y 501, X1 503, and X2 505, respectively) shown in FIG. 13A, FIG. 13B, and FIG. 13C. In FIG. 13D, X1 and X2 are cut lines relating the top down view of FIG. 13D with the cross-section views of FIG. 13A, FIG. 13B, and FIG. 13C. In FIG. 13D, Y shows the cut line to cross-section.

Figures 14A, 14B:
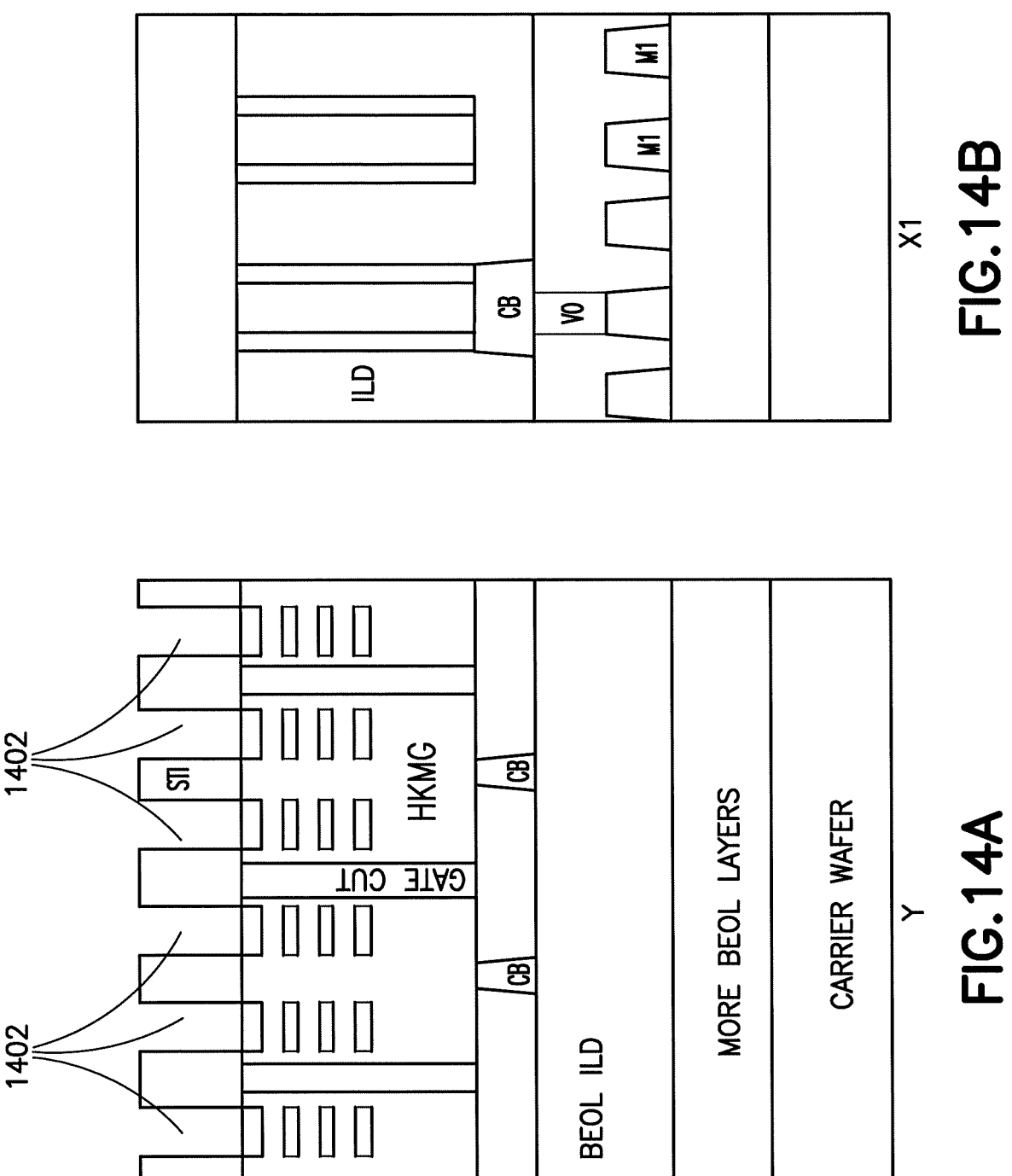
FIG. 14A, FIG. 14B, and FIG. 14C each depict a cross-section view of the integrated circuit after backside interlayer dielectric (ILD) fill and planarization.
Figure 14D:
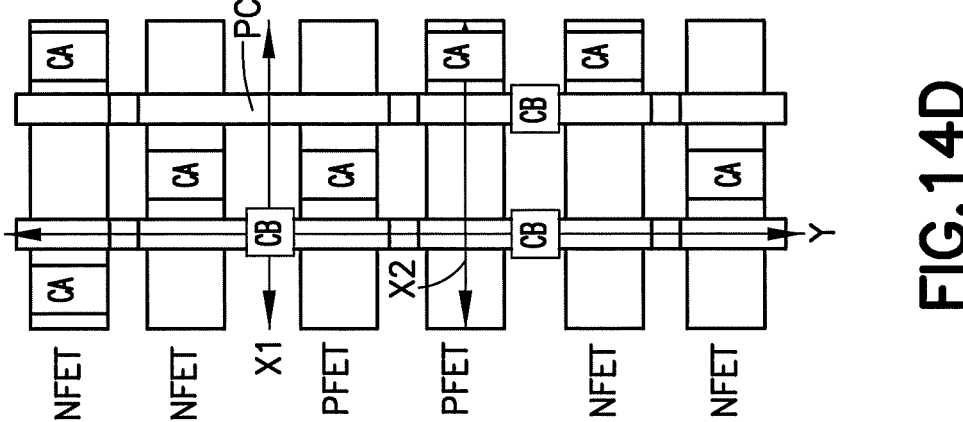
FIG. 14D shows a top down view of the integrated circuit including cut lines (Y, X1, and X2, respectively) relating the top down view with the cross-section views shown in FIGS. 14A, 14B, and 14C.
Figure 14C:
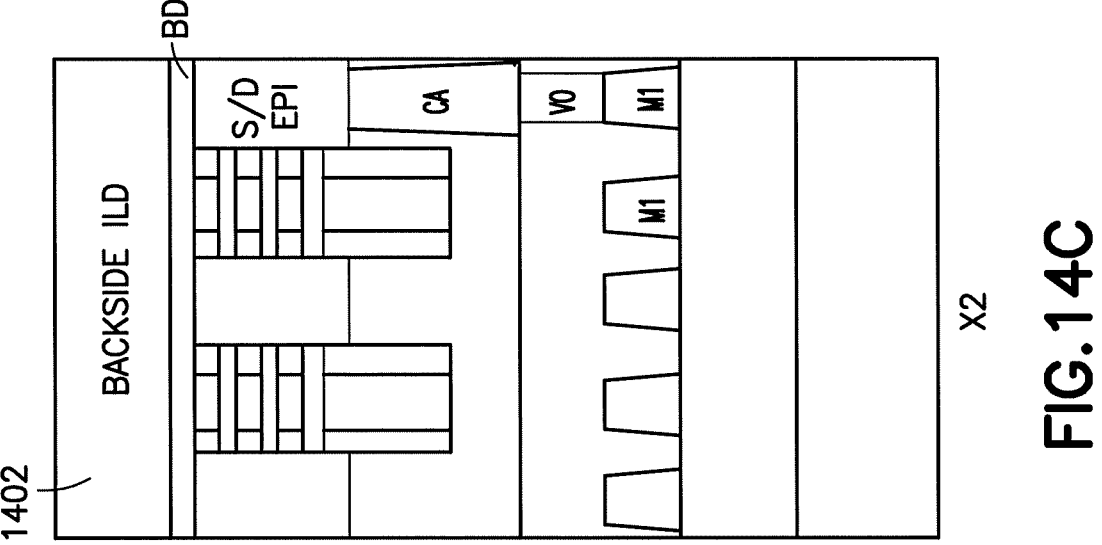

FIG. 14A, FIG. 14B, and FIG. 14C each depict a cut of the integrated circuit after backside interlayer dielectric fill and planarization. FIG. 14A shows that for the Y cut 501, backside interlayer dielectric 1402 is filled in between the shallow trench isolation 604 where the silicon 522 was removed (1302) next to bottom dielectric isolation 802. FIG. 14C shows that for the X2 cut 505, the backside interlayer dielectric 1402 is formed where the silicon 522 was removed (1302) next to bottom dielectric isolation 802. FIG. 14D shows a view of the cuts (Y 501, X1 503, and X2 505, respectively) shown in FIG. 14A, FIG. 14B, and FIG. 14C. In FIG. 14D, X1 and X2 are cut lines relating the top down view of FIG. 14D with the cross-section views of FIG. 14A, FIG. 14B, and FIG. 14C. In FIG. 14D, Y shows the cut line to cross-section.

Figures 15A, 15B:
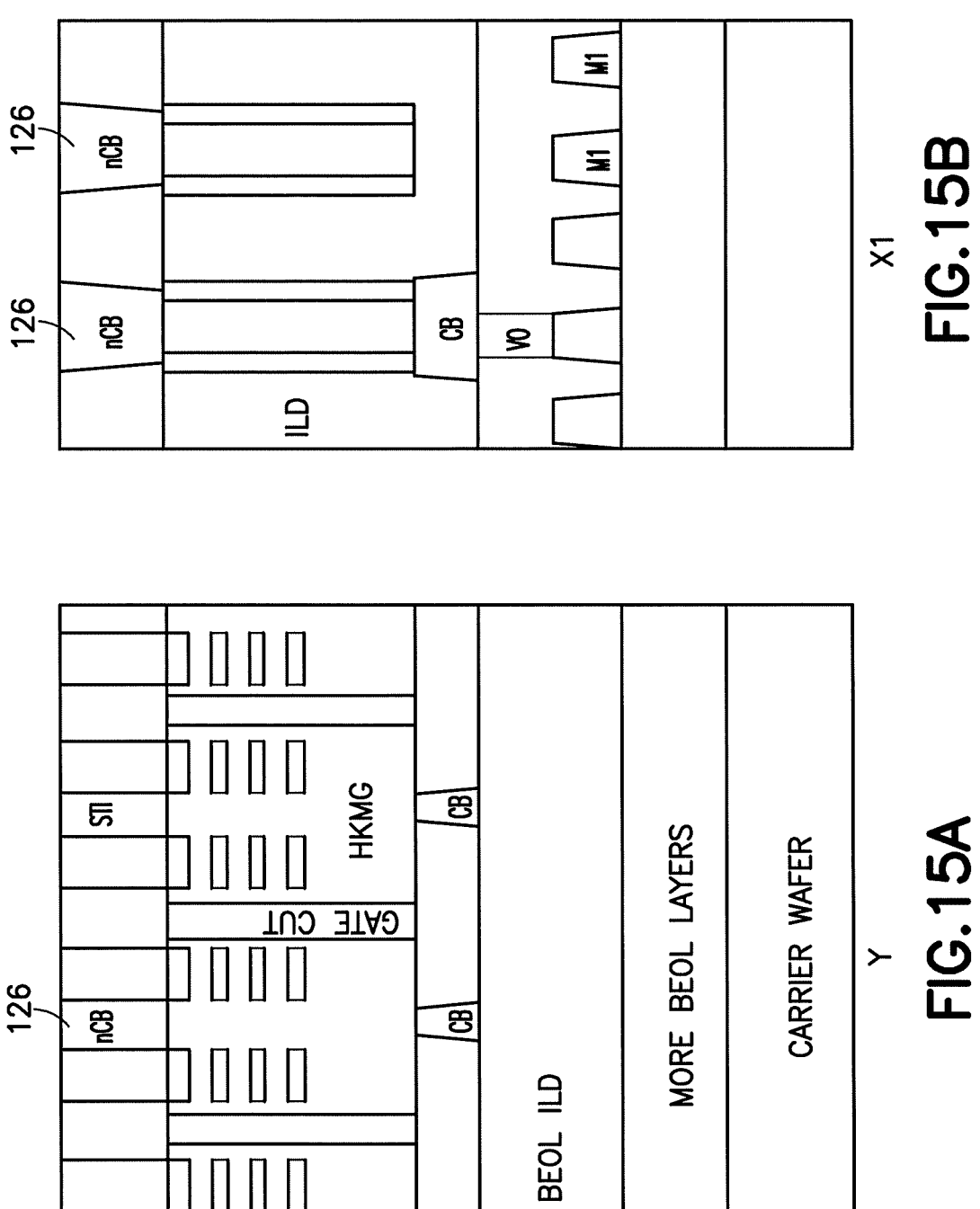
FIG. 15A, FIG. 15B, and FIG. 15C each depict a cross-section view of the integrated circuit after forming a backside contact.
Figure 15D:
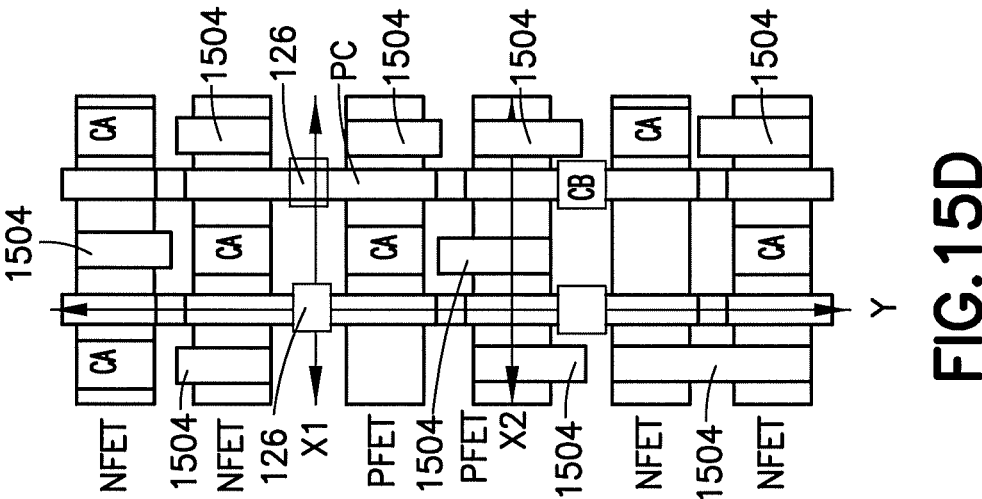
FIG. 15D shows a top down view of the integrated circuit including cut lines (Y, X1, and X2, respectively) relating the top down view with the cross-section views shown in FIGS. 15A, 15B, and 15C.
Figure 15C:
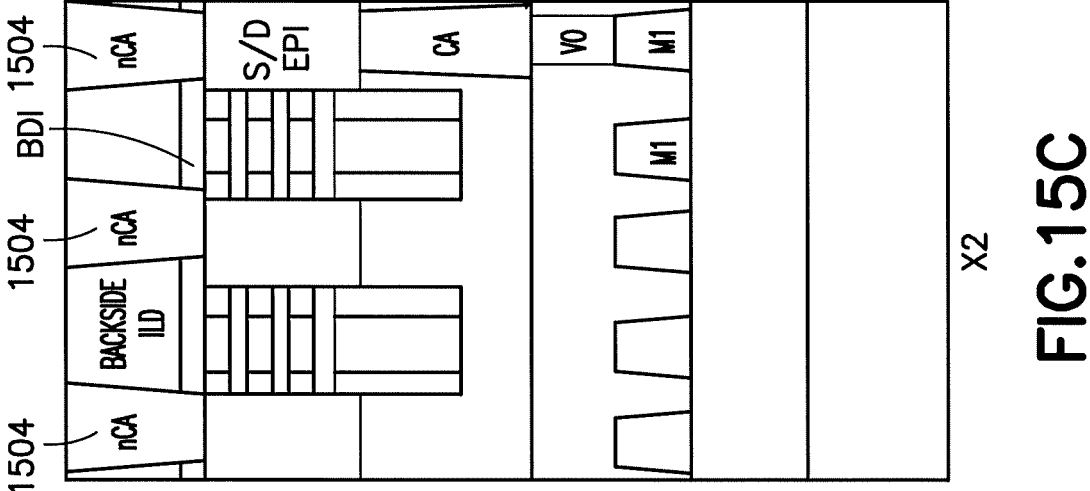

FIG. 15A, FIG. 15B, and FIG. 15C each depict a cut of the integrated circuit after forming a backside contact. FIG. 15A shows that for the Y cut 501, a backside to gate contact 126 is formed within the shallow trench isolation 604 between the backside interlayer dielectric 1402 to contact the high-k metal gate 124. FIG. 15B shows that for the X1 cut 503, backside to gate contacts (126) are formed within shallow trench isolation 604 to contact the high-k metal gates 124 and spacers 804. FIG. 15C shows backside to source/drain contacts (1504) formed within the backside interlayer dielectric 1402 and bottom dielectric isolation 802 to contact the source/drains (906). FIG. 15D shows a view of the cuts (Y 501, X1 503, and X2 505, respectively) shown in FIG. 15A, FIG. 15B, and FIG. 15C. FIG. 15D shows that the backside to source/drain contacts (1504) are formed within N channel field effect transistor regions (504, 506, 512, 514) and the backside to gate contacts (126) are formed between N channel field effect transistor region 506 and P channel field effect transistor region 508 on the gates (516). In FIG. 15D, X1 and X2 are cut lines relating the top down view of FIG. 15D with the cross-section views of FIG. 15A, FIG. 15B, and FIG. 15C. In FIG. 15D, Y shows the cut line to cross-section.

Figures 16A, 16B:
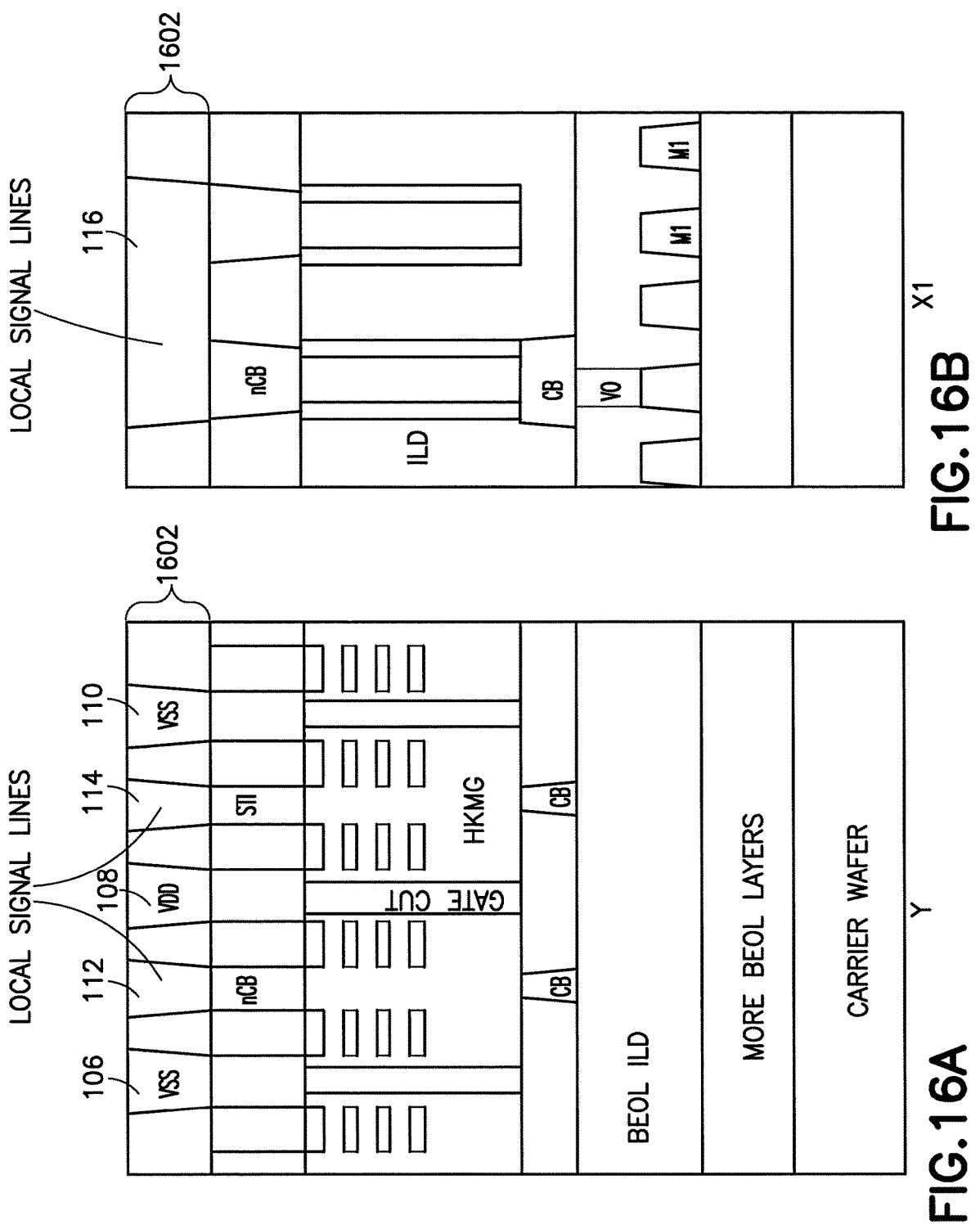
FIG. 16A, FIG. 16B, and FIG. 16C each depict a cross-section view of the integrated circuit after forming a backside power rail and local signal lines.
Figure 16D:
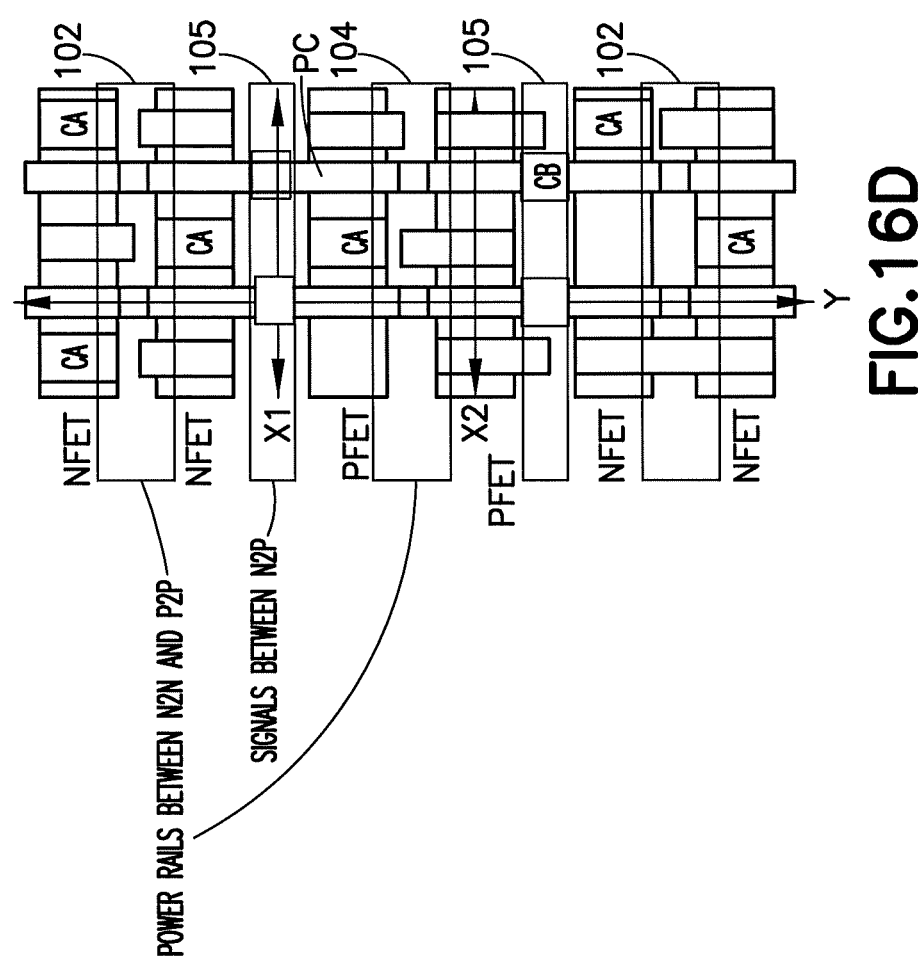
FIG. 16D shows a top down view of the integrated circuit including cut lines (Y, X1, and X2, respectively) relating the top down view with the cross-section views shown in FIGS. 16A, 16B, and 16C.
Figure 16C:
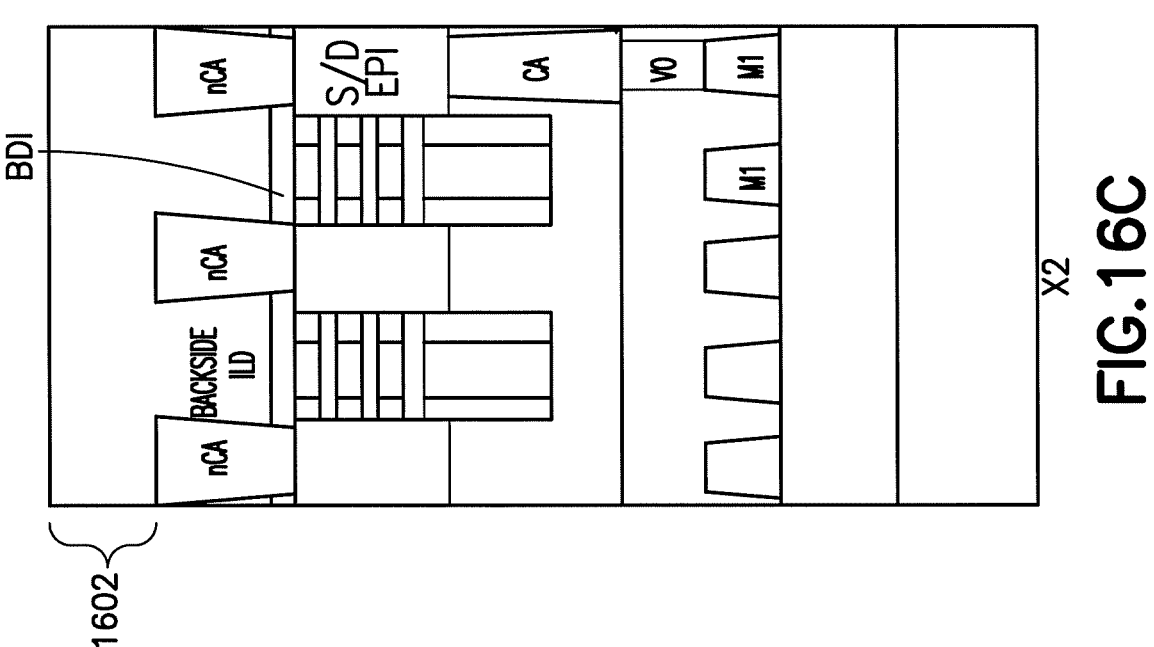

FIG. 16A, FIG. 16B, and FIG. 16C each depict a cut of the integrated circuit after forming a backside power rail and local signal lines. FIG. 16A shows that for the Y cut 501 an additional backside interlayer dielectric 1602 is formed above shallow trench isolation 604 and backside contact 126. The backside power rails (106, 108, 110) and local signal lines (112, 114) are formed within the backside interlayer dielectric 1602. The backside power rails (106, 108, 110) and local signal line 114 are coupled to the shallow trench isolation 604, and local signal line 112 is coupled to backside contact 126. The backside power rails are formed at least partially above backside interlayer dielectric (1402).

FIG. 16B shows that for the X1 cut 503, the additional backside interlayer dielectric 1602 is formed above shallow trench isolation 604 and backside contacts (126). The local signal line 116 is formed within the additional backside interlayer dielectric 1602 and coupled to backside contacts (125) and shallow trench isolation 604. FIG. 16C shows that for the X2 cut 505, the additional backside interlayer dielectric 1602 is formed above backside to source/drain contacts (1504) and backside interlayer dielectric 1402. FIG. 16D shows a view of the cuts (Y 501, X1 503, and X2 505, respectively) shown in FIG. 16A, FIG. 16B, and FIG. 16C. FIG. 16D shows N2N spaces (102), P2P space (104) and N2P spaces (105). The power rails (106, 108, 110) are between the N2N spaces (102) and the P2P space 104. The local signal lines (112, 114, 116) are between the N2P spaces (105). Refer also to FIG. 1. In FIG. 16D, X1 and X2 are cut lines relating the top down view of FIG. 16D with the cross-section views of FIG. 16A, FIG. 16B, and FIG. 16C. In FIG. 16D, Y shows the cut line to cross-section.

Figures 17A, 17B:
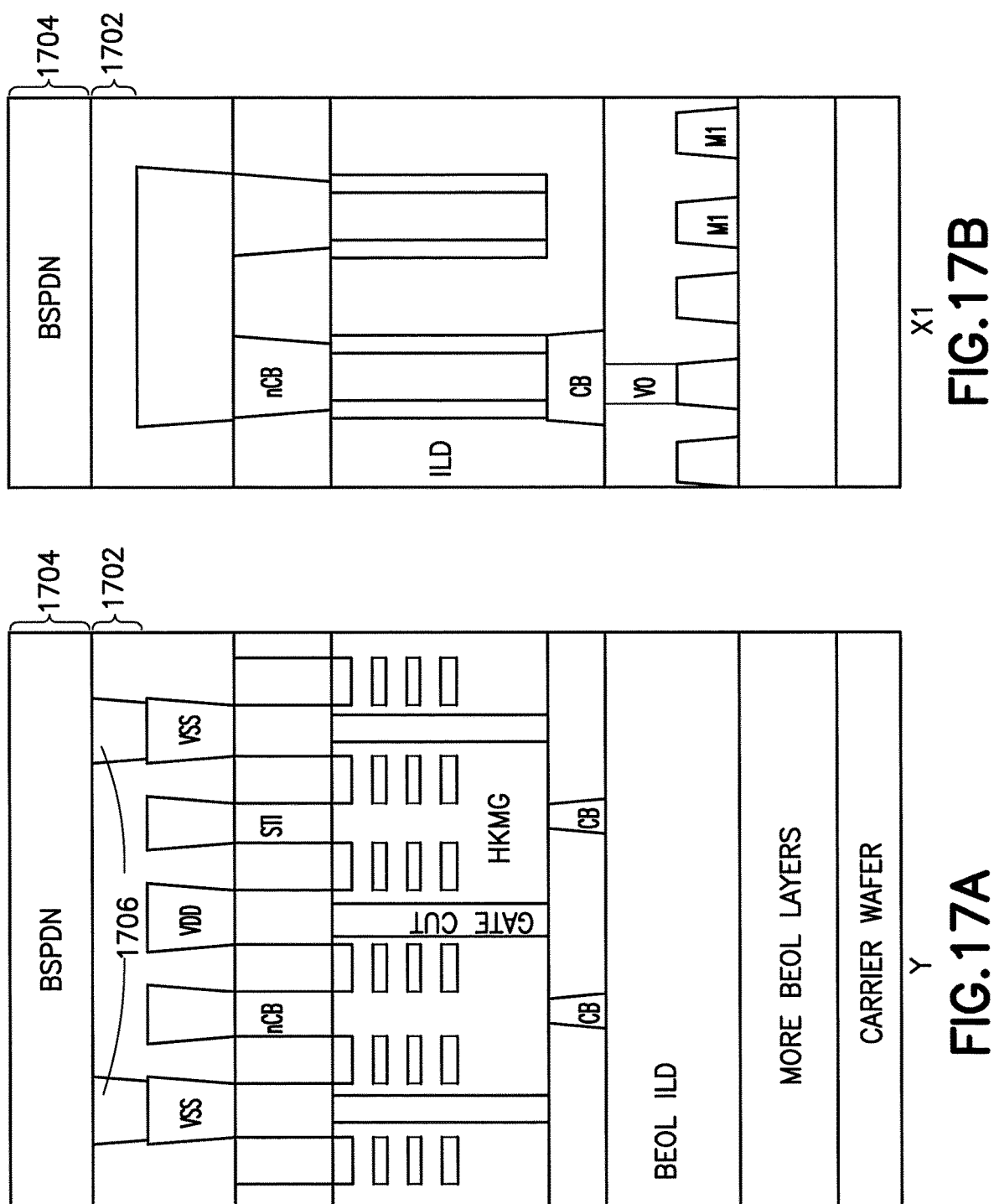
FIG. 17A, FIG. 17B, and FIG. 17C each depict a cross-section view of the integrated circuit after forming a backside power distribution network (BSPDN)
Figure 17D:
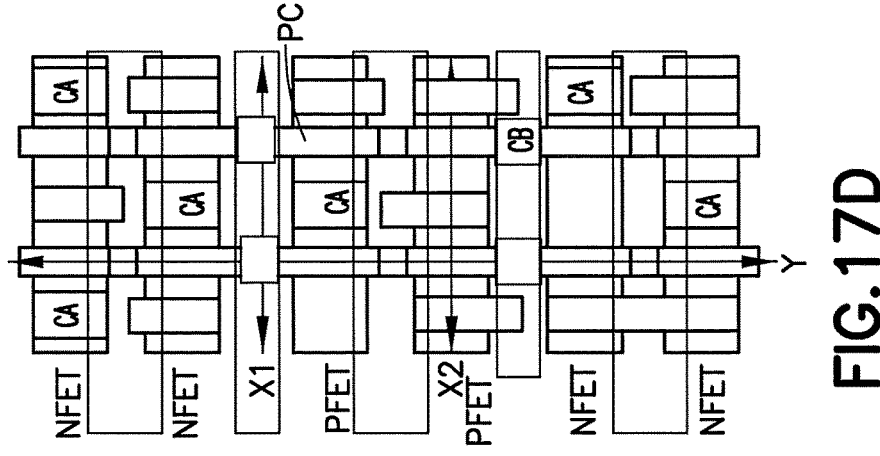
FIG. 17D shows a top down view of the integrated circuit including cut lines (Y, X1, and X2, respectively) relating the top down view with the cross-section views shown in FIGS. 17A, 17B, and 17C.
Figure 17C:
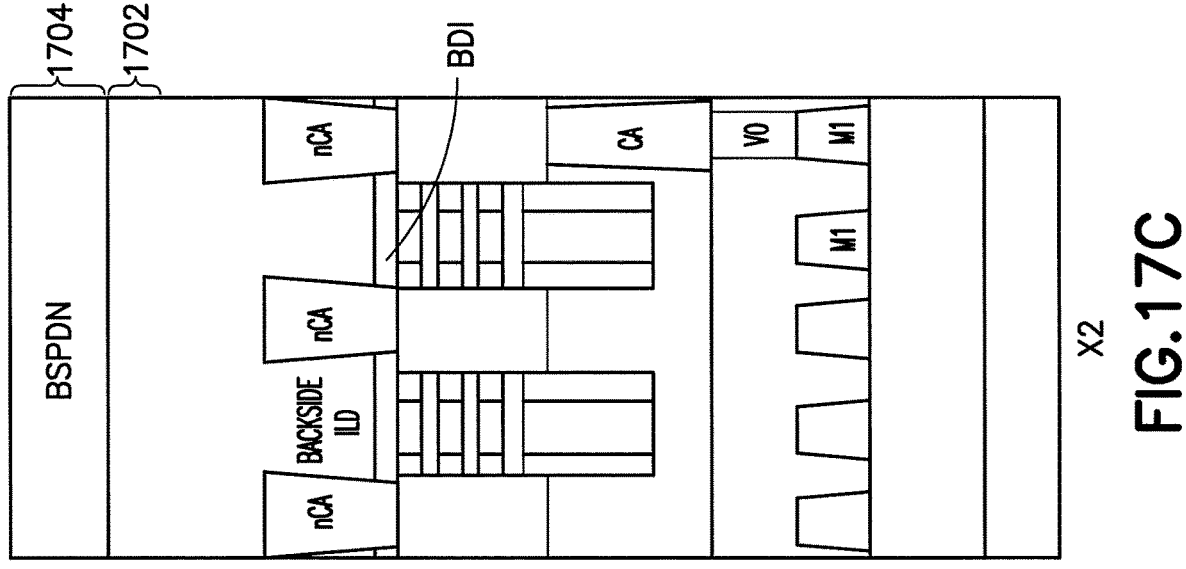

FIG. 17A, FIG. 17B, and FIG. 17C each depict a cut of the integrated circuit after forming a backside power distribution network. FIG. 17A shows that in the Y cut 501, additional backside interlayer dielectric 1702 is formed above backside interlayer dielectric 1602, power rails (106, 108, 110) and local signal lines (112, 114). Vias (1706) are formed within the backside interlayer dielectric 1702 to join the power rails (106, 110) to the formed backside power distribution network (1704). As shown, the backside power distribution network 1704 is formed as partially coupled to backside interlayer dielectric 1702.

FIG. 17B shows that for the X1 cut 503, the backside interlayer dielectric 1702 is formed above backside interlayer dielectric 1602 and local signal line 116, and that the backside power distribution network 1704 is formed next to backside interlayer dielectric 1702. FIG. 17C shows that for the X2 cut 505, the backside interlayer dielectric 1702 is formed above backside interlayer dielectric 1602, and that the backside power distribution network 1704 is formed next to backside interlayer dielectric 1702. FIG. 17D shows a view of the cuts (Y 501, X1 503, and X2 505, respectively) shown in FIG. 17A, FIG. 17B, and FIG. 17C. In FIG. 17D, X1 and X2 are cut lines relating the top down view of FIG. 17D with the cross-section views of FIG. 17A, FIG. 17B, and FIG. 17C. In FIG. 17D, Y shows the cut line to cross-section.

Figure 18B:
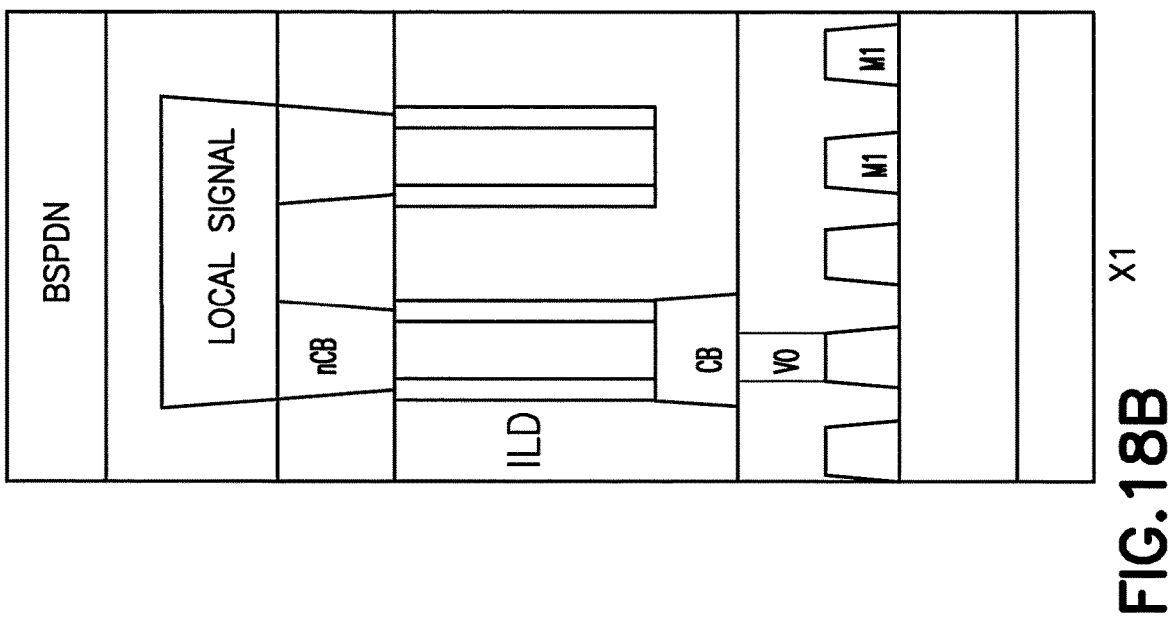
FIG. 18A, FIG. 18B, and FIG. 18C each depict a cross-section of the integrated circuit, where
Figure 18A:
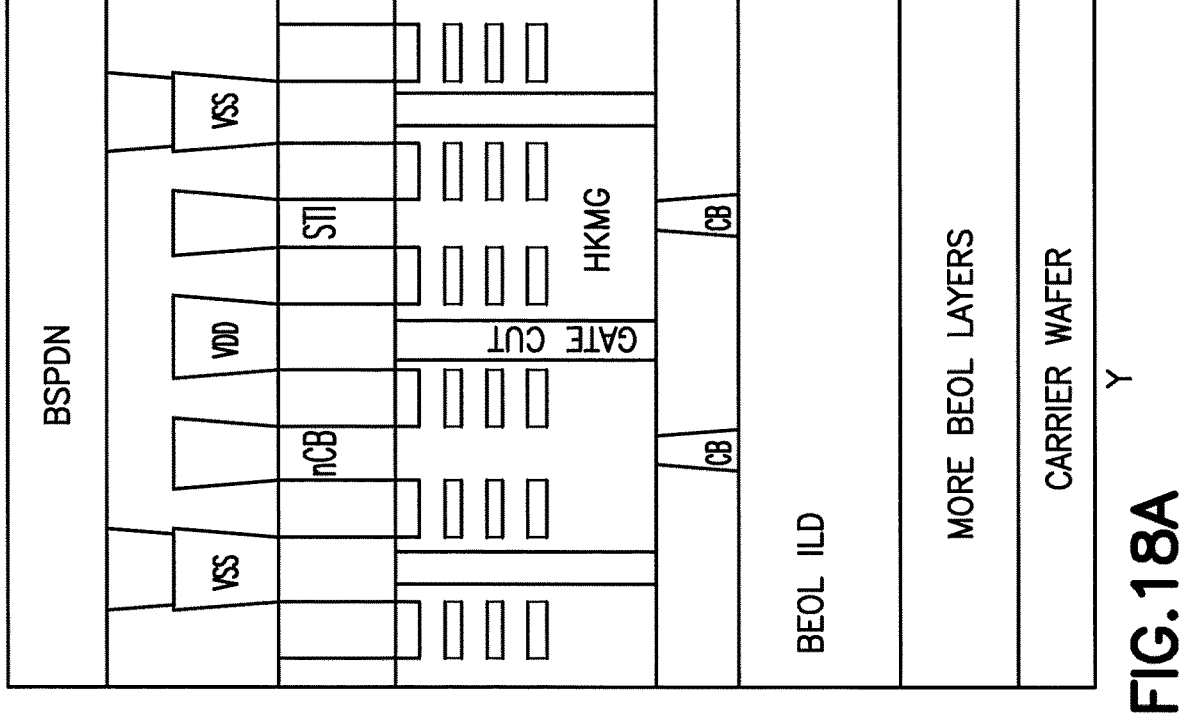
Figure 18D:
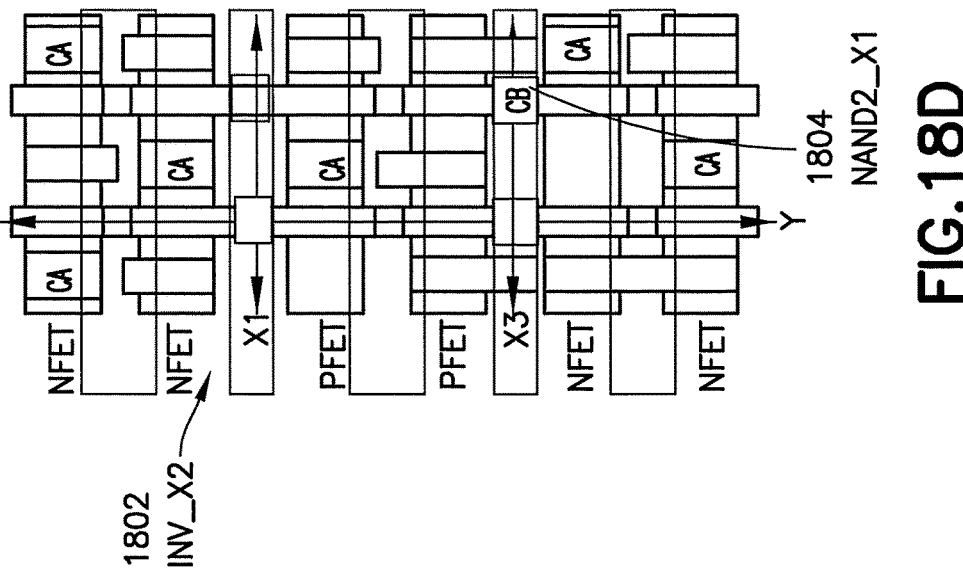
FIG. 18D shows a top down view of the integrated circuit including cut lines (Y, X1, and X3, respectively) relating the top down view with the cross-section views shown in FIGS. 18A, 18B, and 18C.
Figure 18C:
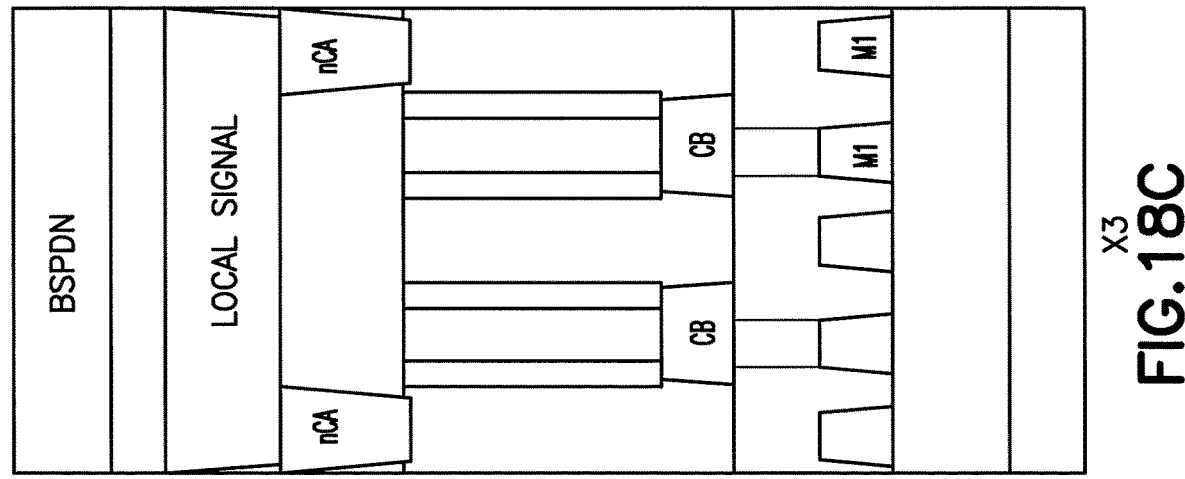

FIG. 18A, FIG. 18B, and FIG. 18C each depict a cut of the integrated circuit, where FIG. 18C depicts the cut X3 507. FIG. 18D shows a view of the cuts (Y 501, X1 503, and X3 507, respectively) shown in FIG. 18A, FIG. 18B, and FIG. 18C. FIG. 18D further shows INV_X2 1802 and NAND2_X1 1804 for the cut X3 507. In FIG. 18D, X1 and X3 are cut lines relating the top down view of FIG. 18D with the cross-section views of FIG. 18A, FIG. 18B, and FIG. 18C. In FIG. 18D, Y shows the cut line to cross-section.

FIG. 19 is a logic flow diagram to fabricate a device, based on the examples described herein. At 1910, the method includes forming, on at least a portion of a substrate (522) of a wafer (500), transistors (113) with at least one gate (124) and at least one source/drain (906). At 1920, the method includes forming frontside contacts (1104, 1106) to some gates (124) and source/drains (906). At 1930, the method includes forming a back end of line (1108, 1110) and a carrier wafer (1112). At 1940, the method includes flipping the wafer (500), and removing at least a portion of the substrate (522). At 1950, the method includes forming backside contacts (126, 1504) to some of the gates (124) and source/drains (906). At 1960, the method includes forming backside power rails (106, 108, 110) to the backside contacts (1504) connected to the source/drains (906). At 1970, the method includes wherein the backside power rails (106, 108, 110) are formed between N channel field effect transistor to N channel field effect transistor spaces (102), and between at least one P channel field effect transistor to P channel field effect transistor space (104). At 1980, the method includes forming backside local signal lines (112, 114) between the backside power rails (106, 108, 110).

Referring now to all the Figures, in one exemplary embodiment, a semiconductor device includes backside power rails located between N channel field effect transistor to N channel field effect transistor spaces, and between at least one P channel field effect transistor to P channel field effect transistor space; and backside local signal lines located between the backside power rails.

The backside power rails may connect to source/drain epitaxies through backside contacts. The backside local signal lines may connect to a source/drain epitaxy or a gate through a backside contact. The semiconductor device may include a cell architecture with the backside local signal lines running horizontally on a backside, and a frontside metal running vertically. The semiconductor device may include at least one pair of adjacent N channel transistors. The backside power rails may include at least one backside N channel power rail for the at least one pair of adjacent N channel transistors, the at least one backside N channel power rail located between the at least one pair of adjacent N channel transistors. The semiconductor device may include two adjacent P channel transistors, wherein at least one N channel transistor of the at least one pair of adjacent N channel transistors is adjacent to a P channel transistor of the two adjacent P channel transistors. The semiconductor device may include at least one backside P channel power rail for the two adjacent P channel transistors, the at least one backside P channel power rail located between the two adjacent P channel transistors. The semiconductor device may include backside local signal lines for the N channel transistors and the P channel transistors, the backside local signal lines located between at least one of the N channel transistors and at least one of the P channel transistors.

In an embodiment, a method of forming a semiconductor device includes forming, on at least a portion of a substrate of a wafer, transistors with at least one gate and at least one source/drain; forming frontside contacts to some gates and source/drains; forming a back end of line and a carrier wafer; flipping the wafer, and removing at least a portion of the substrate; forming backside contacts to some of the gates and source/drains; forming backside power rails to the backside contacts connected to the source/drains; wherein the backside power rails are formed between N channel field effect transistor to N channel field effect transistor spaces, and between at least one P channel field effect transistor to P channel field effect transistor space; and forming backside local signal lines between the backside power rails.

The method may include forming the backside local signal lines to connect to at least one source/drain or to a gate through at least one backside contact. The method may include forming a cell architecture with the backside local signal lines running horizontally on a backside, and a frontside metal running vertically. The method may include forming the backside signal lines at N channel field effect transistor to P channel field effect transistor spaces. The method may include forming at least one pair of adjacent N channel transistors, wherein the backside power rails comprise at least one backside N channel power rail for the at least one pair of adjacent N channel transistors, the at least one backside N channel power rail located between the at least one pair of adjacent N channel transistors; forming two adjacent P channel transistors, wherein at least one N channel transistor of the at least one pair of adjacent N channel transistors is adjacent to a P channel transistor of the two adjacent P channel transistors. The backside power rails may include at least one backside P channel power rail for the two adjacent P channel transistors, the at least one backside P channel power rail located between the two adjacent P channel transistors, and the backside local signal lines are for the N channel transistors and the P channel transistors, the backside local signal lines located between at least one of the N channel transistors and at least one of the P channel transistors.

In another embodiment, a semiconductor device includes two adjacent N channel transistors; two adjacent P channel transistors, wherein a N channel transistor of the two adjacent N channel transistors is adjacent to a P channel transistor of the two adjacent P channel transistors; and wherein backside N channel power rails for the two adjacent N channel transistors are located between the two adjacent N channel transistors and wherein backside P channel power rails for the two adjacent P channel transistors are located between the two adjacent P channel transistors and wherein backside local signal lines for the N channel transistors and P channel transistors are located between the adjacent N channel transistor and P channel transistor.

The semiconductor device may further include at least one backside contact to connect to at least one source/drain or at least one gate. The backside N channel power rails may connect to the at least one source/drain with the at least one backside contact. The backside local signal lines may connect to the at least one source/drain or the at least one gate with the at last one backside contact. The semiconductor device may further include a cell architecture with the backside local signal lines running horizontally on a backside, and a frontside metal running vertically.

References to a 'computer', 'processor', etc. should be understood to encompass not only computers having different architectures such as single/multi-processor architectures and sequential or parallel architectures but also specialized circuits such as field-programmable gate arrays (FPGAs), application specific circuits (ASICs), signal processing devices and other processing circuitry. References to computer program, instructions, code etc. should be understood to encompass software for a programmable processor or firmware such as, for example, the programmable content of a hardware device whether instructions for a processor, or configuration settings for a fixed-function device, gate array or programmable logic device etc.

The memory(ies) as described herein may be implemented using any suitable data storage technology, such as semiconductor based memory devices, flash memory, magnetic memory devices and systems, optical memory devices and systems, non-transitory memory, transitory memory, fixed memory and removable memory. The memory(ies) may comprise a database for storing data.

As used herein, circuitry may refer to the following: (a) hardware circuit implementations, such as implementations in analog and/or digital circuitry, and (b) combinations of circuits and software (and/or firmware), such as (as applicable): (i) a combination of processor(s) or (ii) portions of processor(s)/software including digital signal processor(s), software, and memory(ies) that work together to cause an apparatus to perform various functions, and (c) circuits, such as a microprocessor(s) or a portion of a microprocessor(s), that require software or firmware for operation, even if the software or firmware is not physically present. As a further example, as used herein, circuitry would also cover an implementation of merely a processor (or multiple processors) or a portion of a processor and its (or their) accompanying software and/or firmware. Circuitry would also cover, for example and if applicable to the particular element, a baseband integrated circuit or applications processor integrated circuit for a mobile phone or a similar integrated circuit in a server, a cellular network device, or another network device.

List of abbreviations, which abbreviations may be appended with each other or other characters using e.g. a dash or hyphen ("-"):

A circuit (inverter) input pin (e.g. FIG. 4)
ASIC application-specific integrated circuit
B second input pin in the circuit (e.g. FIG. 4)
BDI bottom dielectric isolation
BEOL back end of line
BOX buried oxide
BPR backside power rail
BSPDN backside power delivery/distribution in network
CA contact to source/drain
CB contact to gate
CMP chemical mechanical planarization/polishing
epi epitaxy
FPGA field-programmable gate array
HKMG high-k metal gate
HM hard mask
ILD interlayer dielectric
INV_X2 inverter X2 circuit
M0 metal layer 0
M0P M0 pitch
M1 metal layer 1
M1P M1 pitch
MOL middle of line
N N channel
NAND not and
NAND2_X1 NAND2_X1 logic circuit
N2N N channel field effect transistor to N channel field effect transistor space
N2P N channel field effect transistor to P channel field effect transistor space
nCA backside contact to source/drain
nCB backside contact to gate
NFET N channel field effect transistor NS nanosheet
n-track n number of tracks
P P channel
P2P P channel field effect transistor to P channel field effect transistor space
PC gate
PFET P channel field effect transistor
Si silicon
SiGe silicon-germanium (e.g. SiGe30, SiGe55, SiGe60)
SiO2 silicon dioxide
STI shallow trench isolation
S/D source/drain
V0 via 0
VA or Va via to source/drain contact
VDD source/drain supply voltage, typically positive voltage
VSS source/drain supply voltage, typically 0V or ground In the foregoing description, numerous specific details are set forth, such as particular structures, components, materials, dimensions, processing steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or processing steps may have been omitted or may have not been described in order to avoid obscuring the presented embodiments.

The description of the present invention has been presented for purposes of illustration and description, but is not intended to be exhaustive or limiting in the form disclosed. Many modifications and variations will be apparent to those of ordinary skill in the art without departing from the scope of the invention. The embodiments were chosen and described in order to best explain the principles of the invention and the practical applications, and to enable others of ordinary skill in the art to understand the invention for various embodiments with various modifications as are suited to the particular uses contemplated.

What is claimed is:

1. A semiconductor device comprising:
backside power rails located between at least one N channel field effect transistor to N channel field effect transistor spaces, and between at least one P channel field effect transistor to P channel field effect transistor spaces; and
backside local signal lines located between the backside power rails, wherein the backside local signal lines connect to at least one source/drain or at least one gate through at least one backside contact.

2. The semiconductor device of claim 1, wherein the backside power rails connect to source/drain epitaxies through respective backside contacts.

3. The semiconductor device of claim 1, further comprising a cell architecture with the backside local signal lines running horizontally on a backside, and a frontside metal running vertically.

4. The semiconductor device of claim 1, further comprising at least one pair of adjacent N channel transistors.

5. The semiconductor device of claim 4, wherein the backside power rails comprise at least one backside N channel power rail for the at least one pair of adjacent N channel transistors, the at least one backside N channel power rail located between the at least one pair of adjacent N channel transistors.

6. The semiconductor device of claim 4, further comprising two adjacent P channel transistors, wherein at least one N channel transistor of the at least one pair of adjacent N channel transistors is adjacent to a P channel transistor of the two adjacent P channel transistors.

7. The semiconductor device of claim 6, further comprising at least one backside P channel power rail for the two adjacent P channel transistors, the at least one backside P channel power rail located between the two adjacent P channel transistors.

8. The semiconductor device of claim 6, further comprising backside local signal lines for the N channel field effect transistors and the P channel field effect transistors, the backside local signal lines located between at least one of the N channel field effect transistors and at least one of the P channel field effect transistors.

9. A semiconductor device comprising:
two adjacent N channel transistors; and
two adjacent P channel transistors, wherein a N channel transistor of the two adjacent N channel transistors is adjacent to a P channel transistor of the two adjacent P channel transistors;
wherein backside N channel power rails for the two adjacent N channel transistors are located between the two adjacent N channel transistors and wherein backside P channel power rails for the two adjacent P channel transistors are located between the two adjacent P channel transistors and wherein backside local signal lines for the N channel transistors and P channel transistors are located between the adjacent N channel transistor and P channel transistor.

10. The semiconductor device of claim 9, further comprising at least one backside contact to connect to at least one source/drain or at least one gate.

11. The semiconductor device of claim 10, wherein the backside N channel power rails connect to the at least one source/drain with the at least one backside contact.

12. The semiconductor device of claim 10, wherein the backside local signal lines connect to the at least one source/drain or the at least one gate with the at least one backside contact.

13. The semiconductor device of claim 9, further comprising a cell architecture with the backside local signal lines running horizontally on a backside, and a frontside metal running vertically.

* * * * *